United States Patent
Sadagopan et al.

(10) Patent No.: US 7,826,688 B1
(45) Date of Patent: Nov. 2, 2010

(54) ENHANCING THE SENSITIVITY OF RESONANT OPTICAL MODULATING AND SWITCHING DEVICES

(75) Inventors: Thiruvikraman Sadagopan, Carlsbad, CA (US); Roger Koumans, Irvine, CA (US); Thierry Pinguet, Cardiff by the Sea, CA (US); Lawrence Cary Gunn, III, Encinitas, CA (US)

(73) Assignee: Luxtera, Inc., Carlsbad, CA (US)

( * ) Notice: Subject to any disclaimer, the term of this patent is extended or adjusted under 35 U.S.C. 154(b) by 87 days.

(21) Appl. No.: 11/584,754

(22) Filed: Oct. 20, 2006

Related U.S. Application Data

(60) Provisional application No. 60/729,085, filed on Oct. 21, 2005.

(51) Int. Cl.
*G02F 1/035* (2006.01)

(52) U.S. Cl. .................. 385/2; 385/1; 385/3; 385/4; 385/5; 385/6; 385/7; 385/8; 385/9

(58) Field of Classification Search .......... None
See application file for complete search history.

(56) References Cited

U.S. PATENT DOCUMENTS

| | | |
|---|---|---|
| 3,462,211 A | 8/1969 | Nelson et al. |
| 3,634,788 A | 1/1972 | Craven |
| 3,970,364 A | 7/1976 | Gerson et al. |
| 3,976,358 A | 8/1976 | Thompson |
| 4,420,873 A | 12/1983 | Leonberger et al. |
| 4,669,086 A | 5/1987 | Kaede et al. |
| 4,728,167 A | 3/1988 | Soref et al. |
| 4,776,655 A | 10/1988 | Robertson et al. |
| 4,787,691 A | 11/1988 | Lorenzo et al. |
| 4,857,973 A | 8/1989 | Yang et al. |
| 4,874,216 A | 10/1989 | Utaka et al. |
| 4,877,299 A | 10/1989 | Lorenzo et al. |
| 4,956,682 A | 9/1990 | Ohmaka et al. |
| 4,958,898 A | 9/1990 | Friedman et al. |

(Continued)

FOREIGN PATENT DOCUMENTS

EP 0 726 477 A2 8/1996

(Continued)

OTHER PUBLICATIONS

Sadagopan et al., "Optical Modulators Based on Depletion Width Translation in Semiconductor Microdisk Resonators," IEEE Photonics Technology Letters, vol. 17, No. 3, pp. 567-569, Mar. 2005.

(Continued)

*Primary Examiner*—Uyen-Chau N Le
*Assistant Examiner*—Chad H Smith
(74) *Attorney, Agent, or Firm*—Knobbe Martens Olson & Bear, LLP

(57) ABSTRACT

Embodiments of the inventions described herein comprise a device and method for manipulating an optical beam. The method comprises propagating an optical beam through a waveguide in proximity to a resonant cavity and pumping the resonant cavity with sufficient optical power to induce nonlinearities in the refractive index of the resonant cavity. The method further comprises tuning the resonant frequency band of the resonant cavity with a modulation signal such that the optical beam is manipulated in a useful way.

44 Claims, 12 Drawing Sheets

U.S. PATENT DOCUMENTS

| | | |
|---|---|---|
| 4,999,686 A | 3/1991 | Autier et al. |
| 5,001,523 A | 3/1991 | Lomashevich et al. |
| 5,003,359 A | 3/1991 | Abeles |
| 5,033,812 A | 7/1991 | Yoshida et al. |
| 5,048,907 A | 9/1991 | Wickman et al. |
| 5,061,030 A | 10/1991 | Miyamoto et al. |
| 5,078,516 A | 1/1992 | Kapon et al. |
| 5,101,459 A | 3/1992 | Sunagawa |
| 5,109,464 A | 4/1992 | Munowitz et al. |
| 5,125,065 A | 6/1992 | Stoll et al. |
| 5,132,843 A | 7/1992 | Aoyama et al. |
| 5,146,513 A | 9/1992 | Inoue et al. |
| 5,148,507 A | 9/1992 | Tanisawa |
| 5,199,092 A | 3/1993 | Stegmueller |
| 5,200,939 A | 4/1993 | Nishiwaki et al. |
| 5,222,162 A | 6/1993 | Yap et al. |
| 5,225,740 A | 7/1993 | Ohkawa |
| 5,227,701 A | 7/1993 | McIntyre |
| 5,274,720 A | 12/1993 | Yamato |
| 5,303,319 A | 4/1994 | Ford et al. |
| 5,314,107 A | 5/1994 | d'Aragona et al. |
| 5,329,601 A | 7/1994 | Nakamura |
| 5,343,490 A | 8/1994 | McCall |
| 5,347,601 A | 9/1994 | Ade et al. |
| 5,363,457 A | 11/1994 | Falt et al. |
| 5,436,991 A | 7/1995 | Sunagawa et al. |
| 5,459,807 A | 10/1995 | Doumuki et al. |
| 5,491,768 A | 2/1996 | Chan |
| 5,534,824 A | 7/1996 | Nalos et al. |
| 5,546,494 A | 8/1996 | Eda |
| 5,613,020 A | 3/1997 | Uchida et al. |
| 5,625,725 A | 4/1997 | Nakano et al. |
| 5,625,729 A | 4/1997 | Brown |
| 5,654,818 A | 8/1997 | Yao |
| 5,682,455 A | 10/1997 | Kovacic et al. |
| 5,684,817 A | 11/1997 | Houdre et al. |
| 5,703,989 A | 12/1997 | Khan et al. |
| 5,710,849 A | 1/1998 | Little et al. |
| 5,737,474 A | 4/1998 | Aoki et al. |
| 5,742,433 A | 4/1998 | Shiono et al. |
| 5,745,630 A | 4/1998 | Vawter et al. |
| 5,759,453 A | 6/1998 | Kato |
| 5,784,400 A | 7/1998 | Joannopoulos et al. |
| 5,841,931 A | 11/1998 | Foresi et al. |
| 5,854,866 A | 12/1998 | Leonard |
| 5,889,898 A | 3/1999 | Koren et al. |
| 5,908,305 A | 6/1999 | Crampton et al. |
| 5,917,195 A | 6/1999 | Brown |
| 5,917,981 A | 6/1999 | Kovacic et al. |
| 5,920,662 A | 7/1999 | Hinkov |
| 5,926,496 A | 7/1999 | Ho et al. |
| 5,930,437 A | 7/1999 | Nakai et al. |
| 5,955,749 A | 9/1999 | Joannopoulos et al. |
| 6,009,115 A | 12/1999 | Ho |
| 6,052,495 A | 4/2000 | Little et al. |
| 6,055,342 A | 4/2000 | Yi et al. |
| 6,101,300 A | 8/2000 | Fan et al. |
| 6,108,464 A | 8/2000 | Foresi et al. |
| 6,134,369 A | 10/2000 | Kurosawa |
| 6,151,430 A | 11/2000 | Traver, Jr. et al. |
| 6,175,671 B1 | 1/2001 | Roberts |
| 6,195,187 B1 | 2/2001 | Soref et al. |
| 6,229,947 B1 | 5/2001 | Vawter et al. |
| 6,243,517 B1 | 6/2001 | Deacon |
| 6,261,525 B1 | 7/2001 | Minaee |
| 6,278,822 B1 | 8/2001 | Dawnay |
| 6,285,813 B1 | 9/2001 | Schultz et al. |
| 6,374,001 B1 | 4/2002 | Bozeat et al. |
| 6,396,984 B1 | 5/2002 | Cho et al. |
| 6,400,490 B1 | 6/2002 | Hosoi |
| 6,411,752 B1 | 6/2002 | Little et al. |
| 6,466,342 B1 | 10/2002 | Frigo et al. |
| 6,507,681 B1 | 1/2003 | Kowalczyk et al. |
| 6,549,685 B2 | 4/2003 | Marks et al. |
| 6,614,977 B2 | 9/2003 | Johnson et al. |
| 6,631,225 B2 | 10/2003 | Lee et al. |
| 6,633,696 B1 | 10/2003 | Vahala et al. |
| 6,636,668 B1 | 10/2003 | Al-hemyari et al. |
| 6,687,425 B2 | 2/2004 | Ridgway et al. |
| 6,731,846 B2 | 5/2004 | Hosomi et al. |
| 6,734,453 B2 | 5/2004 | Atanackovic et al. |
| 6,751,368 B2 | 6/2004 | Lim et al. |
| 6,759,675 B2 | 7/2004 | Csutak et al. |
| 6,768,855 B1 | 7/2004 | Bakke et al. |
| 6,801,702 B2 | 10/2004 | Day |
| 6,831,938 B1 | 12/2004 | Gunn, III |
| 6,834,152 B2 | 12/2004 | Gunn et al. |
| 6,839,488 B2 | 1/2005 | Gunn |
| 6,865,314 B1 | 3/2005 | Blair et al. |
| 6,895,148 B2 | 5/2005 | Gunn |
| 6,897,498 B2 | 5/2005 | Gothoskar et al. |
| 6,917,727 B2 | 7/2005 | Gunn |
| 6,928,224 B2* | 8/2005 | Beall et al. .................. 385/132 |
| 6,961,490 B2 | 11/2005 | Maisenhoelder et al. |
| 6,990,257 B2 | 1/2006 | Gunn |
| 7,082,235 B2 | 7/2006 | Gunn |
| 7,095,010 B2 | 8/2006 | Scherer et al. |
| 7,116,853 B2 | 10/2006 | Gunn |
| 7,120,338 B2 | 10/2006 | Gunn |
| 7,127,147 B2 | 10/2006 | Gunn et al. |
| 7,136,544 B1 | 11/2006 | Gunn |
| 7,164,821 B2 | 1/2007 | Gunn |
| 7,167,606 B2 | 1/2007 | Gunn et al. |
| 2002/0031321 A1 | 3/2002 | Lee et al. |
| 2002/0057720 A1 | 5/2002 | Nomura et al. |
| 2002/0081055 A1 | 6/2002 | Painter et al. |
| 2002/0090160 A1 | 7/2002 | Lim et al. |
| 2002/0090163 A1 | 7/2002 | Lim et al. |
| 2002/0094150 A1 | 7/2002 | Lim et al. |
| 2002/0094183 A1 | 7/2002 | Wu et al. |
| 2002/0164118 A1 | 11/2002 | Paddon et al. |
| 2002/0164129 A1 | 11/2002 | Jackson |
| 2002/0164143 A1 | 11/2002 | Csutak et al. |
| 2003/0002766 A1 | 1/2003 | Pruneri et al. |
| 2003/0031446 A1 | 2/2003 | Gao et al. |
| 2003/0040134 A1 | 2/2003 | Deliwala |
| 2003/0068151 A1 | 4/2003 | Gunn et al. |
| 2003/0174945 A1 | 9/2003 | Fried et al. |
| 2003/0190107 A1 | 10/2003 | Walker |
| 2004/0022474 A1 | 2/2004 | Lim et al. |
| 2004/0037503 A1 | 2/2004 | Hastings et al. |
| 2004/0076362 A1 | 4/2004 | Wong et al. |
| 2004/0114867 A1* | 6/2004 | Nielsen et al. ................. 385/40 |
| 2004/0126054 A1* | 7/2004 | Griffel .......................... 385/15 |
| 2005/0123259 A1 | 6/2005 | Gunn et al. |
| 2006/0193556 A1* | 8/2006 | Frisken ......................... 385/27 |

FOREIGN PATENT DOCUMENTS

| | | |
|---|---|---|
| EP | 0 751 409 A2 | 1/1997 |
| GB | 2 243 241 A | 10/1991 |
| JP | 63-106605 | 5/1988 |
| JP | 406201934 A | 7/1994 |
| JP | 2001-4877 | 1/2001 |
| WO | WO 02/082134 A1 | 10/2002 |
| WO | WO 02/082146 A1 | 10/2002 |
| WO | WO 03/107051 | 12/2003 |

OTHER PUBLICATIONS

Quanfan Xu et al., "Micrometre-scale silicon electro-optic modulator," Nature, vol. 435, pp. 325-327, May 2005.

G. Priem et al., "Design of All-Optical Nonlinear Functionalities Based on Resonators," IEEE Journal of Selected Topics in Quantum Electronics, vol. 10, No. 5, Sep./Oct. 2004.

H.K. Tsang et al., "Optical dispersion, two-photon absorption and self-phase modulation in silicon waveguides at 1.5 µm wavelength," Applied Physics Letters, vol. 80, No. 3, Jan. 2002.
Jacques I. Pankove, "Optical Processes in Semiconductors," Dover Publications, pp. 264-267, 1971.
R.A. Soref et al., "Electrooptical Effects in Silicon," IEEE Journal of Quantum Electronics, vol. QE-23, No. 1, Jan. 1987, pp. 123-129.
Ph. Lalanne et al., Modal conversion with artificial materials for photonic-crystal waveguides, Optics Express, vol. 10, No. 8, Apr. 22, 2002, pp. 354-359.
Azzam, R. M. A. and N. M. Bashara, "Generalized Ellipsometry for Surfaces with Directional Preference: Application to Diffraction Gratings," J. Opt. Soc. Am. vol. 62, No. 12, Dec. 1972, pp. 1521-1523.
Ogawa, K., W. S. C. Chang, B. L. Sopori, and F. J. Rosenbaum, "A Theoretical Analysis of Etched Grating Couplers for Integrated Optics," IEEE J. Quantum Electron., vol. QE-9, No. 1, Jan 1973, pp. 29-42.
Neviere, M:, R. Petit, and M. Cadilhac, "About the Theory of Optical Grating Coupler-Waveguide Systems," Optics Comm. vol. 8, No. 2, Jun. 1973, pp. 113-117.
Neviere, M., P. Vincent, R. Petit and M. Cadilhac, "Systematic Study of Resonances of Holographic Thin Film Couplers," Optics Comm., vol. 9, No. 1, Sep. 1973, pp. 48-53.
Neviere, M., P. Vincent, R. Petit and M. Cadilhac, "Determination of the Coupling Coefficient of a Holographic Thin Film Coupler," Optics Comm., vol. 9, No. 3, Nov. 1973, pp. 240-245.
Ulrich, R., "Efficiency of optical-grating couplers," J. Opt. Soc. Am., vol. 63, No. 11, Nov. 1973, pp. 1419-1431.
Marcuse, D., "Exact Theory of TE-Wave Scatterings From Blazed Dielectric Gratings," The Bell Systems Technical Journal, vol. 55, No. 9, Nov. 1976, pp. 1295-1317.
Tamir, T. and S. T. Peng, "Analysis and Design of Grating Couplers," Appl. Phys., 14, 235-254 (1977).
Yariv, A. and M. Nakamura, "Periodic Structures for Integrated Optics," IEEE J. Quantum Electron, vol. QE-13, No. 4, Apr. 1977, pp. 233-253.
Loewen, E. G. and M. Neviere, "Dielectric coated gratings: a curious property," Appl. Optics, vol. 16, No. 11, Nov. 1977, pp. 3009-3011.
Maystre, D. "A new general integral theory of dielectric coated gratings," J. Opt. Soc. Am., vol. 68, No. 4, Apr. 1978, pp. 490-495.
Lee W., and W. Streifer, "Radiation loss calculations for corrugated dielectric waveguides," J. Opt. Soc. Am., vol. 68, No. 12, Dec. 1978, pp. 1701-1707.
Tamir, T. Integrated Optics. Chapt. 3, Couplers, Springer-Verlag, New York, 1979, pp. 83-137.
Lee W., and W. Streifer, "Radiation loss calculations for corrugated dielectric waveguides. II. TM polarization," J. Opt. Soc. Am., vol. 69, No. 12, Dec. 1979, pp. 1671-1676.
Chang, K. C. and T. Tamir, "Simplified approach to surface-wave scattering by blazed dielectric gratings," Appl. Opt. vol. 19, No. 2, Jan. 15, 1980, pp. 282-288.
Chang, K. C., V. Shah and T. Tamir, "Scattering and guiding of waves by dielectric gratings with arbitrary profiles," J. Opt. Soc. Am., vol. 70, No. 7, Jul. 1980, pp. 804-813.
Miyanaga, S. and T. Asakura, "Intensity profile of outgoing beams from uniform and linearly tapered grating couplers," Appl. Opt., vol. 20, No. 4, Feb. 15, 1981, pp. 688-695.
Moharam, M. G. and T. K. Gaylord, "Diffraction analysis of dielectric surface-relief gratings," J. Opt. Soc. Am., vol. 72, No. 10, Oct. 1982, pp. 1385-1392.
Gaylord, T, K. and M. G. Moharam, "Analysis and Applications of Optical Diffraction by Gratings," Proc. IEEE, vol. 73, No. 5, May 1985, pp. 894-937.
Suhara, T. and H. Nishihara, "Integrated Optics Components and Devices Using Periodic Structures," IEEE J. Quantum Electronics, vol. QE-22, No. 6, Jun. 1986, pp. 845-867.
Avrutsky, I. A., A. S. Svakhin and V. A. Sychugov, "Interference phenomena in waveguides with two corrugated boundaries," J. Modern Optics, vol. 36, No. 10, 1989, pp. 1303-1320.
Avrutsky, I. A., A. S. Svakhin and V. A. Sychugov, "High-efficiency single-order waveguide grating coupler," Opt. Lett., vol. 15, No. 24, Dec. 15, 1990, pp. 1446-1448.

Li, L. and M. C. Gupta, "Effects of beam focusing on the efficiency of planar waveguide grating couplers," Appl. Opt., vol. 29, No. 36, Dec. 20, 1990, pp. 5320-5325.
Gupta, M. C. and L. Li, "Effect of beam defocus on the efficiency of planar waveguide grating couplers," Appl. Opt., vol. 30, No. 30, Oct. 20, 1991, pp. 4402-4405.
Bates, K. A., L. Li, R. L. Roncone and J. J. Burke. "Gaussian beams from variable groove depth grating couplers in planar waveguides." Appl. Opt. vol. 32, No. 12, Apr. 20, 1993, pp. 2112-2116.
Najaf, S. I. M. Fallahi, P. Lefebvre, C. Wu and I. Templeton, "Integrated Optical Circular Grating Tap Power Divider," Electron. Lett., vol. 29, No. 16, Aug. 5, 1993, pp. 1417-1418.
L.C. West et al., "Non-uniform grating couplers for coupling of Gaussian beams to compact waveguides," Integrated Photonics Research Technical Digest, Optical Society of America, 1994, 3 pages.
L.C. West, C. Roberts, J. Dunkel, G. Wojcik and J. Mould, "Non-uniform grating couplers for coupling of Gaussian beams to compact waveguides," Preprint of paper for IPR Tech. Dig., OSA, 1994.
Hagberg, M., N. Eriksson, T. Kjellberg and A. Larsson, "Dependence of output grating efficiency on detuning in surface grating output couplers," Opt. Lett., vol. 20, No. 2, Jan 15, 1995, pp. 180-182.
Moharam, M. G., D. A. Pommet, E. B. Grann and T. K. Gaylord, "Stable implementation of the rigorous coupled-wave analysis for surface-relief gratings: enhanced transmittance matrix approach," J. Opt. Soc. Am. A, vol. 12, No. 5, May 1995, pp. 1077-1086.
Schmitz, M., R. Brauer and O. Bryngdahl, "Gratings in the resonance domain as polarizing beam splitters," Opt. Lett., vol. 20, No. 17, Sep. 1, 1995, pp. 1830-1831.
Pascal, D., R. Orobtchouk, A. Layadi, A. Koster and S. Laval, "Optimized coupling of a Gaussian beam into an optical waveguide with a grating coupler: comparison of experimental and theoretical results," Appl. Opt., vol. 36, No. 12, Apr. 20, 1997, pp. 2443-2447.
Fallahi, M., K. J. Kasumic, S. Penner, O. Nordman and N. Peyghambarian, "Design and fabrication of circular grating coupled distributed Bragg reflector lasers," Opt. Eng. vol. 37, No. 4, Apr. 1998, pp. 1169-1174.
Sheard, S. J., M. Li and T. D. Liao, "Waveguide Grating Couplers," obtained from www.eng.ox.ac.uk/~holsjs/research/files/Couplers.pdf on Apr. 14, 2003, original date online unknown.
Lalanne, P., J. Hazart, P. Chavel, E. Cambril and H. Launois, "A transmission polarizing beam splitter grating," J. Opt. A: Pure Appl. Opt., vol. 1 (1999), pp. 215-219.
Backlund, J., J. Bengtsson, C. Carlstrom and A. Larsson, "Incoupling waveguide holograms for simultaneous focusing into multiple arbitrary positions," Appl. Opt., vol. 38, No. 27, Sep. 20, 1999, pp. 5738-5746.
Backlund, J., J. Bengtsson, C Carlstrom and A. Larsson, "Multifunctional Grating Couplers for Bidirectional Incoupling into Planar Waveguides," IEEE PTL, vol. 12, No. 3, Mar. 2000, pp. 314-316.
Orobtchouk, R., A. Layadi, H. Gualous, D. Pascal, A. Koster and S. Laval, "High-efficiency light coupling in a submicrometric silicon-on-insulator waveguide," Appl. Opt., vol. 39, No. 31, Nov. 1, 2000, pp. 5773-5777.
Moreno, E., E. Emi, C. Hafner and R. E. Kunz, "Theoretical Modeling and Optimization of Integrated Optical Nanostructures," CSEM—Scientific and Technical Report 2000.
Mossberg, T. W., "Planar holographic optical processing devices," Opt. Lett. vol. 26, No. 7, Apr. 1, 2001, pp. 414-416.
Backlund, J., J. Bengtsson, C Carlstrom and A. Larsson, "Waveguide Input Grating Coupler for Wavelength-Division Multiplexing and Wavelength Encoding," IEEE Photon. Tech. Lett., vol. 13. No. 8, Aug. 2001, pp. 815-817.
Landru, N., D. Pascal and A. Koster, "Modelling of two-dimensional grating couplers on silicon-on-insulator waveguides using beam propagation method," Opt. Comm., vol. 196, Sep. 1, 2001, pp. 139-147.
Mossberg, T. W., "Lithographic holography in planar waveguides," SPIE's International Technical Group Newsletter. Nov. 2001, vol. 12, No. 2., pp. 7-8.

Backlund, J., J. Bengtsson, C Carlstrom and A. Larsson,"Input waveguide grating couplers designed for a desired wavelength and polarization response," *Appl. Opt.*, vol. 41, No. 15, May 20, 2002, pp. 2818-2825.

Tallied, D., W. Bogaerts, P. Bienstman, T. F. Krauss, P. Van Daele, I. Moerman, S. Verstuyft, K. De Mesel and R. Baets, "An Out-of-Plane Grating Coupler for Efficient Butt-Coupling Between Compact Planar Waveguides and Single-Mode Fibers," *IEEE J. of Quantum Electron*, vol. 38, No. 7, Jul. 2002, pp. 949-955.

Ang, T.W. et al., "Highly efficient unibond silicon-on-insulator blazed grating couplers," *Applied Physics Letters*, vol. 77, No. 25, Dec. 18, 2000, pp. 4214-4216.

Emmons, R.M. et al., "Buried-Oxide Silicon-on-Insulator Structures II: Waveguide Grating Couplers," *IEEE Journal of Quantum Electronics*, vol. 28, No. 1, Jan. 1992, pp. 164-175.

Moharam, M.G. and Gaylord, T.K., "Rigorous coupled-wave analysis of grating diffraction—E-mode polarization and losses," *J. Opt. Soc. Am.*, vol. 73, No. 4, Apr. 1983, pp. 451-455.

Li, L., "Symmetries of cross-polarization diffraction coefficients of gratings," *J. Opt. Soc. Am. A.*, vol. 17, No. 5, May 2000, pp. 881-887.

M. Palamaru et al., "Photonic crystal waveguides: Out-of-plane losses and adiabatic modal conversion," *Applied Physics Letters*, vol. 78, No. 11, Mar. 12, 2001, pp. 1466-1468.

T. Happ et al., "Photonic crystal tapers for ultracompact mode conversion," *Optics Letters*, vol. 26, No. 14, Jul. 15, 2001, pp. 1102-1104.

A. Talneau et al., "Low-reflection photonic-crystal taper for efficient coupling between guide sections of arbitrary widths," *Optics Letters*, vol. 27, No. 17, Sep. 1, 2002, pp. 1522-1524.

Y. Xu et al., "Adiabatic coupling between conventional dielectric waveguides and waveguides with discrete translational symmetry," *Optics Letters*, vol. 25, No. 10, May 15, 2000, pp. 755-757.

E. Yablonovitch, "Photonic band-gap structures," *J. Opt. Soc. Am. B*, vol. 10, No. 2, Feb. 1993, pp. 283-295.

D. Labilloy et al., "Diffraction Efficiency and Guided Light Control by Two-Dimensional Photonic-Bandgap Lattices," *IEEE Journal of Quantum Electronics*, vol. 35, No. 7, Jul. 1999, pp. 1045-1052.

International Search Report for International Application No. PCT/US02/29030, dated Feb. 20, 2003.

International Search Report for International Application No. PCT/US02/28873, dated Mar. 11, 2003.

International Search Report for International Application No. PCT/US02/29027, dated Feb. 26, 2003.

Amnon Yariv, "Quantum Electronics," $3^{rd}$ edition, John Wiley & sons, Jan. 17, 1989, pp. 378-379.

\* cited by examiner

FIG. 9A
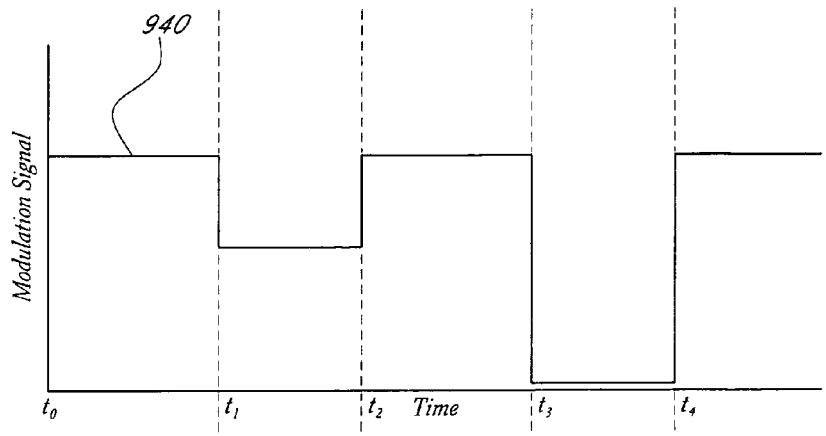
FIG. 9B
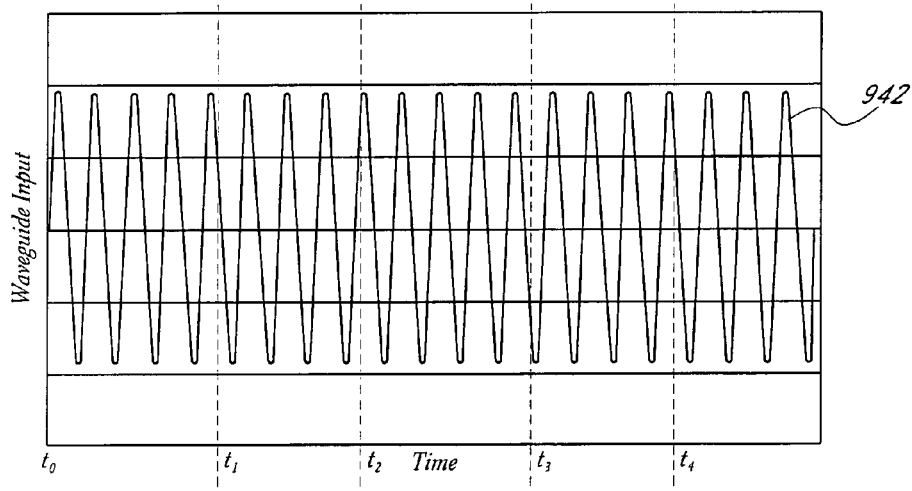
FIG. 9
| FIG. 9A |
| FIG. 9B |
| FIG. 9C |
| FIG. 9D |

…

ENHANCING THE SENSITIVITY OF RESONANT OPTICAL MODULATING AND SWITCHING DEVICES

CROSS-REFERENCE TO RELATED APPLICATIONS

This application claims priority to U.S. provisional patent application 60/729,085, filed Oct. 21, 2005, which is hereby incorporated by reference in its entirety.

FIELD OF THE INVENTION

The present invention is related to photonic devices in general, and more particularly to controlling an optical signal in an optical integrated circuit.

DESCRIPTION OF THE RELATED ART

Light offers many advantages when used to create signals for propagating information, the foremost of which are increased speed and bandwidth. In comparison with electrical signals, optical signals have the potential of being switched and modulated faster, and can include a greater number of separate signals multiplexed together in a common channel.

In an exemplary optical communication system, a beam of light can be emitted from a source, commonly a laser diode, and modulated by an information signal. Commonly, the information signal is an electric signal and the modulator is an electro-optical modulator. The modulated optical signal is then propagated some distance, ranging from microns to miles, to a detector and demodulator where the information signal is recovered. In this manner, information can be transmitted from one location to another at very high bandwidths.

A variety of photonic devices are needed to realize the sort of optical system described above. For example, modulators, filters, switches, transmitters, and detectors of various kinds are needed.

SUMMARY OF THE INVENTION

A method for manipulating an optical beam, having a bandwidth centered about λ1, is disclosed, said method comprising: propagating an optical beam along a first waveguide; attenuating the optical beam in said first waveguide by inducing destructive interference with a resonant cavity proximal to said first waveguide, said resonant cavity comprising a medium optically transmissive to said optical beam and having an effective refractive index, n; modulating said attenuation induced in said first waveguide by tuning and detuning said resonant cavity, said tuning and detuning accomplished by varying a modulation signal applied to said resonant cavity to alter the effective refractive index, n, of said medium in said tunable resonant cavity; and increasing the sensitivity of the tunable resonant cavity to said modulation signal by providing optical energy of sufficient intensity within the resonant cavity to induce optical non-linearities in the medium in said resonant cavity.

A device for modulating an optical beam, having a bandwidth centered about λ1, is disclosed, said device comprising: a first waveguide for propagating said optical beam therethrough; a tunable resonant cavity in proximity to said first waveguide, said resonant cavity having an effective refractive index, said optical beam propagating through said first waveguide being attenuated when said tunable resonant cavity is tuned to resonate at said wavelength, λ1, thereby modulating said optical beam in said first waveguide; and an optical pump optically coupled to said tunable resonant cavity, said optical pump configured to pump said tunable resonant cavity with sufficient power to induce optical non-linearities in the effective refractive index of said tunable resonant cavity to increase tuning sensitivity of said tunable resonant cavity.

BRIEF DESCRIPTION OF THE DRAWINGS

Preferred embodiments of the present invention are described below in connection with the accompanying drawings.

DETAILED DESCRIPTION OF THE PREFERRED EMBODIMENT

Figure 1:
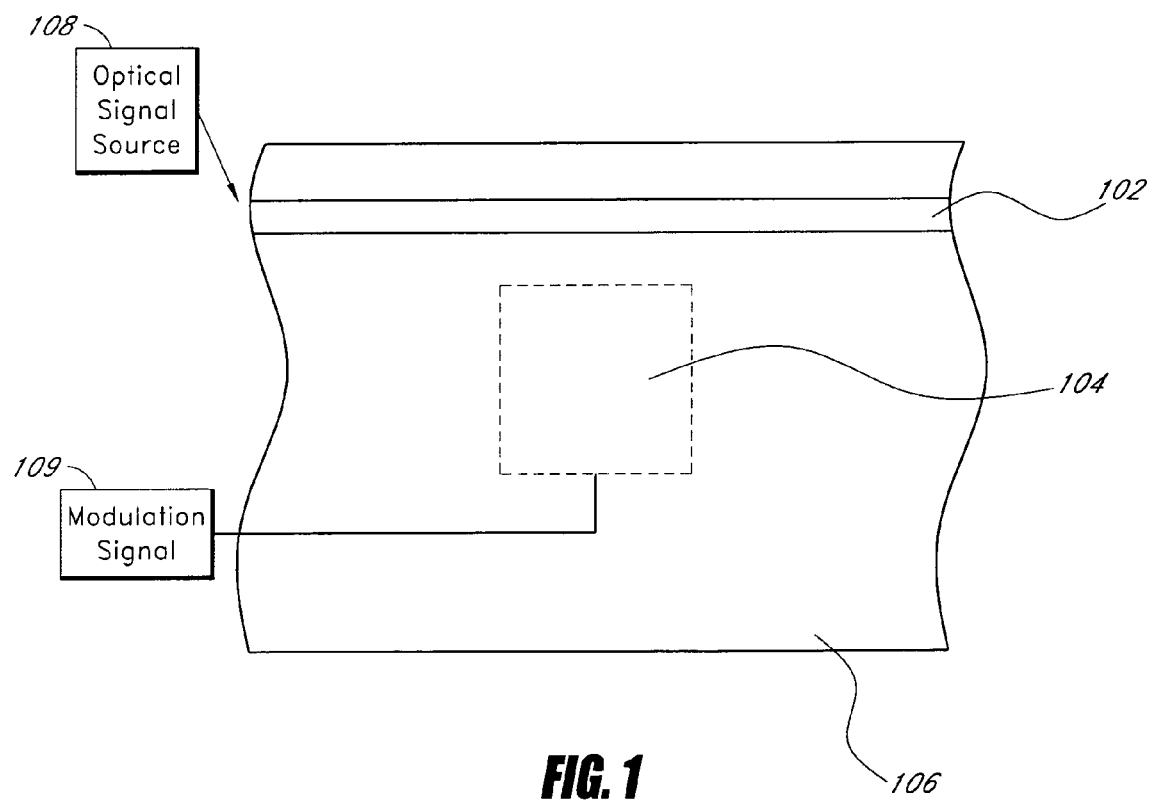
FIG. 1 is a schematic representation of an optical device including a waveguide disposed in proximity to a tunable resonant cavity.

FIG. 1 shows a schematic illustration of an optical device which includes a waveguide 102 disposed on a substrate 106. The waveguide 102 has an input where an optical source 108 can inject an optical beam which propagates through the waveguide 102 toward the waveguide's output at the opposite end. In some embodiments, the optical beam from the source 103 is a continuous wave (CW) signal having a wavelength, λ1, which is modulated to create an information-carrying optical signal.

The device also includes a tunable resonant cavity disposed on the substrate 106 in proximity to the waveguide 102. The tunable resonant cavity is disposed near enough to the waveguide 102 to permit some degree of light coupling between the waveguide 102 and the resonant cavity 104. The coupling occurs as a result of the mode overlap between the optical waveguide mode and mode in the ring resonator. The amount of energy coupled from the waveguide 102 into the resonant cavity 104 is proportional to the mode overlap between the two modes.

There are many types of resonant cavities, each of which may be used in one embodiment or another of the present invention due to that particular cavity's unique characteristics. These may include linear cavities (e.g. a Fabry-Perot cavity), ring cavities (e.g. a circular ring resonator, an oval ring resonator), etc. Every resonant cavity has one or more frequencies at which it resonates. In practice, resonant cavities are generally somewhat lossy so that this resonance effect is not limited to a single frequency but rather to a resonant frequency band of some width.

Figure 2:
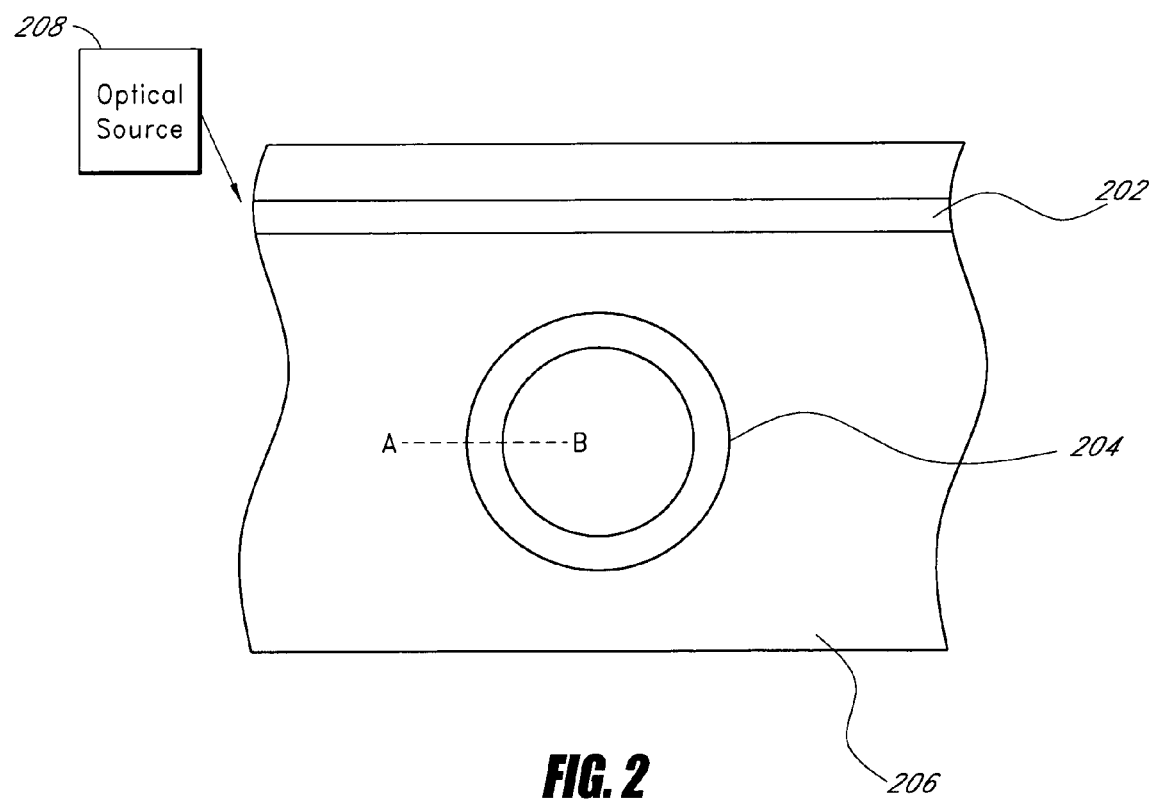
FIG. 2 is a schematic representation of an optical device including a waveguide disposed in proximity to a tunable ring resonator.

In one embodiment, i.e. the resonant cavity shown in FIG. 2, the resonant cavity 104 comprises a closed optical path. Light of a wavelength λ1 propagates through the waveguide 102 and is coupled into the resonant cavity 104, where it travels around the closed path. When the wavelength of the optical energy is such that the overlapping modes between the resonant cavity 104 and the waveguide 102 destructively interfere with one another, which occurs when λ1 lies within the resonant band of the resonant cavity 104, then the signal strength at the output of the waveguide 102 becomes relatively weak. If λ1 lies outside the resonant band of the resonant cavity 104, then the overlapping modes constructively interfere and signal strength at the output of the waveguide is relatively strong.

The resonant cavity 104 is a tunable resonant cavity. What is meant by this is that the resonant band of the resonant cavity 104 can be selectively shifted to higher or lower wavelengths. This tuning action can be controlled by a separate signal, for example a modulation signal. When the resonant cavity 104 is tuned such that the wavelength, λ1, of the optical beam lies outside the resonant band, the strength of the optical signal at the output of the waveguide 102 is relatively strong. However, when the resonant cavity 104 is tuned such that the wavelength, λ1, of the optical beam lies within the resonant band of the cavity 104, then the strength of the optical signal at the output of the waveguide 102 becomes relatively weak. Thus, the device illustrated in FIG. 1 can act as an optical modulator because varying the position of the resonant band of the resonant cavity 104 with a modulation signal has the effect of modulating the signal strength of the optical signal at the output of the waveguide 102.

If the beam of light injected into the waveguide 102 is of sufficient intensity, then it can produce certain non-linear effects in the resonant cavity 104 material. These effects triggered by the elevated intensity of the optical power within the resonant cavity 104 can include the non-linear Kerr Effect. The non-linear Kerr effect results in a change in the refractive index of the resonant cavity 104 material that is proportional to the square of the electric field strength within the cavity. The non-linear effects cause changes in the refractive index of the resonant cavity material which in turn affect the characteristics of the resonant frequency band in ways that allow for the creation of more sensitive, efficient optical modulators, switches, etc., as described below. While previously known lithium niobate optical modulators rely on effects that may be characterized as non-linear optical effects (of the $X^{(2)}$ type) produced by an applied voltage, embodiments of the present invention utilize a non-linear optical effect (Kerr effect based on $X^{(3)}$ non-linearities) that is induced by the intensity of the optical energy within a material.

In some embodiments, the beam of light in the waveguide 102 that is coupled into the resonant cavity 104 is amplified by an amplifier (not shown). In various preferred embodiments, this amplifier amplifies the signal such that the intensity of light within the resonant cavity 104 is sufficient to induce non-linear effects and increase the sensitivity of the resonant cavity. In some embodiments, this amplifier comprises a quarternary indium gallium arsenide phosphide material or III-V material. Such an amplifier may be flip chip coupled or otherwise coupled to the waveguide 102. In some embodiments, coupling an/or amplification may be by a fiber and/or a fiber amplifier.

In other less preferred embodiments, a separate light pump source (not shown) can be used to inject a high-power pump signal into the resonant cavity 104 to bring about the above-described non-linear effects. In other words, rather than setting the power level of the optical beam which is modulated at a sufficiently high level to induce the intensity-related non-linear optical effects within the resonant cavity 104, a separate optical source can be provided for this purpose. In these pumped embodiments, the optical pump beam can be injected into the waveguide 102 via the same waveguide port as the first optical beam, a different port of the waveguide 102, via a separate waveguide, or directly into the resonant cavity 104. The optical pump can be a CW beam with a wavelength, λ2, which can be somewhat different than λ1, allowing the two beams to be separated by a filtering operation at a later processing step, or in some cases identical.

In both the non-pumped and pumped embodiments, the power level of the optical energy supplied to the resonant cavity 104 can be maintained at a relatively static level such that the above-described non-linear effects are continuously present within the resonant cavity 104 material. In other instances, the power level can be modulated between lower and higher levels to transition the optical effects within the resonant cavity 104 material between predominantly linear and predominantly non-linear regimes. This type of transition between linear and non-linear modes of operation can be used to achieve certain effects described in more detail below.

FIG. 2 illustrates one embodiment of the optical device of FIG. 1. Here, a ring resonator 204 is substituted for the generic resonant cavity 104 of FIG. 1. FIG. 2 also shows a waveguide 202 disposed on a substrate 206 in proximity to the ring resonator 204. In FIG. 2, a single optical source 208 is used; thus a non-pumped embodiment is illustrated, though an optical pump source could also be included.

Figure 3:
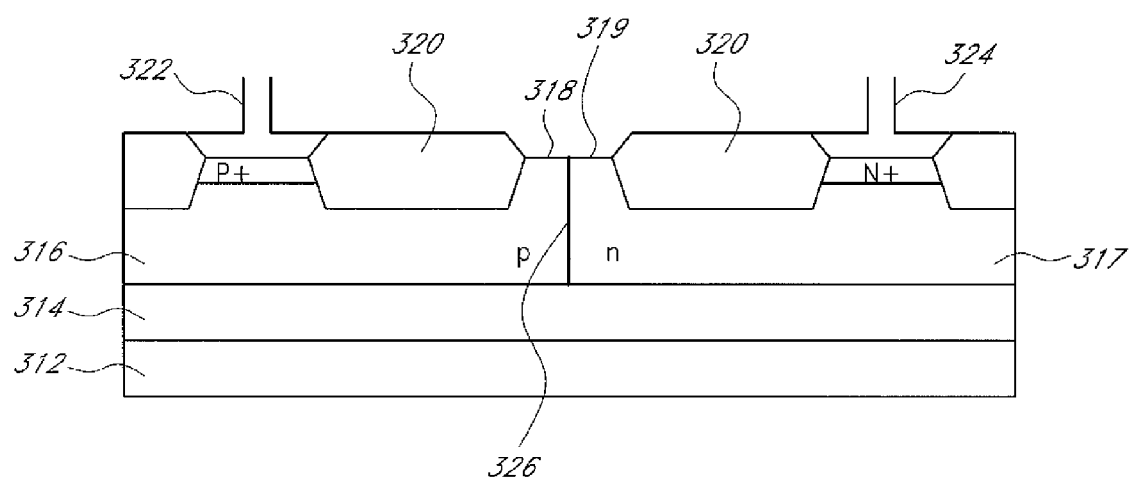
FIG. 3 is a schematic representation of an embodiment of a tunable ring resonator.

FIG. 3 illustrates a cross sectional view of the resonant cavity 204 through the line A-B. In this embodiment, the resonant cavity 204 comprises a ridge waveguide with a slab portion 316, 317 and a ridge portion 318, 319. The ridge portion 318, 319 has the effect of confining optical energy to the ridge itself, as well as the area of the slab portion 316, 317 located beneath the ridge 318, 319. Thus, the ridge waveguide forms an annular, closed ring in which optical energy can propagate.

The ridge waveguide is formed on top of a cladding layer 314, which in turn is formed on a substrate 312. The ridge waveguide, comprising the slab portion 316, 317 and the ridge portion 318, 319, preferably has a higher index of refraction than the cladding layer 314. In one preferred embodiment, the ridge waveguide comprises doped crystal silicon and the cladding layer 314 comprises a silicon dioxide layer (e.g., a buried-oxide layer) on a silicon substrate.

The dimensions of the ridge waveguide will, in part, determine the optical mode or modes that are supported, their spatial extent, and the associated wavelengths. In some embodiments, these dimensions are selected so as to support a single mode within the resonant cavity 204, such as the "whispering gallery."

A layer of cladding material 320 covers portions of the ridge waveguide 316-319. In certain embodiments, the cladding material 320 has a relatively low refractive index in comparison to the ridge waveguide such that light energy is substantially confined to the waveguide. In one embodiment, the cladding material comprises silicon dioxide, though other cladding materials are also possible.

The material comprising the ridge waveguide 316-319 is preferably substantially transparent and non-absorptive to the wavelength light for which the resonant cavity 204 is designed. As mentioned, in certain embodiments, ridge waveguide, 316-319 material can comprise doped crystalline silicon. Those of skill in the art will recognize that other materials may be used, however, including other semiconductors (e.g. InGaAsP) and other forms of silicon besides crystalline silicon. Any material that is used will generally have a substantially high refractive index in comparison with the cladding material 320, 314 such that optical energy is confined within the cavity.

In certain embodiments of the invention, a first section 316, 318 of the ridge waveguide comprises doped p-type silicon, while a second section 317, 319 of the ridge waveguide comprises doped n-type silicon. In some embodiments of the invention, the doping levels within the first section 316, 318 and the second section 317, 319 of the ridge waveguide can be graded rather than constant. For example, it may be desirable to increase the doping level of the material near an electrode to improve the conductivity of an electrical contact, while decreasing the level of doping near the portions of the waveguide where optical energy is confined to limit optical power loss within the waveguide.

In other embodiments, the doping is reversed so that the first section 316, 318 of the waveguide comprises doped n-type silicon, while the second section 317, 319 comprises doped p-type silicon. In either case, a depletion region 326 is formed at the pn junction between the two sections. The depletion region is formed by the diffusion of mobile charge carriers from the n and p type materials across the pn junction. The charge carriers, electrons and holes, recombine, creating a depletion region substantially bereft of mobile charge carriers. The width of the depletion region can be modulated by applying an electric field across the pn junction. When the pn junction is reverse-biased, the depletion region 326 will become wider, while it will narrow to the point of extinction when the junction is forward-biased. Modulating the width of the depletion region 326 changes the density of free carriers in the region of the ridge waveguide 316-319 where optical energy exists. This in turn corresponds to changes in the refractive index of the resonant cavity material. Generally speaking, areas with higher densities of charge carriers will exhibit a lower refractive index, while areas with lower densities of charge carriers will exhibit a higher refractive index.

The resonant cavity 204 further includes a first electrode 322 electrically connected to the first section of the ridge waveguide 316, 318. The first electrode 322 is electrically connected to a voltage source (or common ground). This voltage source may output a voltage waveform of any arbitrary shape depending on the particular application. In certain preferred embodiments, the voltage source comprises a high-speed electrical modulation signal. The resonant cavity 204 further includes a second electrode 324 electrically coupled to the second section of the ridge waveguide 317, 319. The electrodes may be coupled to the ridge waveguide 316-319 via ohmic contacts. The second electrode 324 is also electrically coupled to a voltage source (or common ground) allowing for the application of an electric potential difference across the pn junction 326. Other configurations for establishing an externally imposed electric field across the pn junction are also possible. The electrodes 322, 324 preferably comprise metal, although one of skill in the art would recognize that other materials, such as doped polysilicon, may be used. In many embodiments it may be preferable to position the electrodes away from the light path portion of the resonant cavity 204 since metals are generally very light-absorbent.

Light traveling within the resonant cavity 204 can interfere constructively or destructively with itself and with overlapping modes from the waveguide 202 depending upon the length of the closed path, the wavelength of the light, and the effective index of refraction along that path. More particularly, the controlling relationship is between the wavelength and the optical path length (OPD) of the optical path in the resonant cavity, i.e., product of the physical length of the path and the effective index of refraction along that path. Light traveling on paths for which the total optical path length is an even number of half-wavelengths will experience constructive interference; light traveling on paths for which the total optical path length is an odd number of half-wavelengths will experience destructive interference. Because of this phenomenon, the resonant cavity 204 contains one or more standing waves at certain frequencies associated with different modes.

It is generally known that the mth resonant frequency, $v_m$, of a generic resonant cavity is given by $$v_m = \frac{mc}{n_{eff}l}$$

where m is the mode number (an integer), c is the speed of light in a vacuum, $n_{eff}$ is the effective index of refraction of the mode in the resonator, and l is the path length of a full round trip inside the cavity.

Modulation of the resonant frequency of the optical resonant cavity 204 may be achieved by changing the effective index of refraction of the material comprising the perimeter portion of the cavity. Changing the index also changes the effective optical path length, thus changing the resonant frequency as dictated by the above equation.

The effective index of refraction of a mode is proportional to the real refractive index, $n_0$, such that:

$$n_{eff} = n_r n_0$$

where $n_r$ depends upon the geometry of the waveguide. The change in the resonant frequency, $\Delta v$, due to a change in the refractive index, $\Delta n$, is given by:

$$\Delta v = -\frac{v_m}{n_0}\Delta n.$$

As discussed above, the refractive index of a semiconductor, such as silicon, is dependent upon the existence of free carriers within the semiconductor, such that increasing the number of free carriers in a region generally lowers the refractive index of that region. Conversely, decreasing the number of free carriers in a region raises the refractive index of that region. Thus, by manipulating the number of free carriers in a region of a semiconductor, like single crystal or polycrysalline silicon, the refractive index of that region may be controlled. Changing the refractive index changes the effective optical path length of the cavity, and, by extension, the resonant frequency. Accordingly, the resonant cavity can be tuned.

The density of free carriers in the region of the resonant cavity 204 where optical energy is confined may be changed by modulating the width of the depletion region 326 at the pn junction. This can be done by applying a voltage between the strip and slab electrodes 322, 324 such that the pn junction is reverse biased, and then modulating the width of the depletion region 326 with the electric signal by varying the degree to which the pn junction is reverse-biased.

Modulation of the width of the depletion region 326 enables control of the free carriers and free carrier density in at least a portion of the resonant cavity 204 where optical energy is confined, thereby providing strong interaction between the carriers and the light. The ability to variably control the refractive index permits tuning of the resonant frequency of the cavity. In other words, the resonant frequency band of the cavity can be selectively shifted to higher or lower wavelengths. The electric signal applied across the electrodes 322 and 324 can be a modulation signal, which can carry information, to modulate the optical beam propagating through the waveguide 202.

Figure 4:
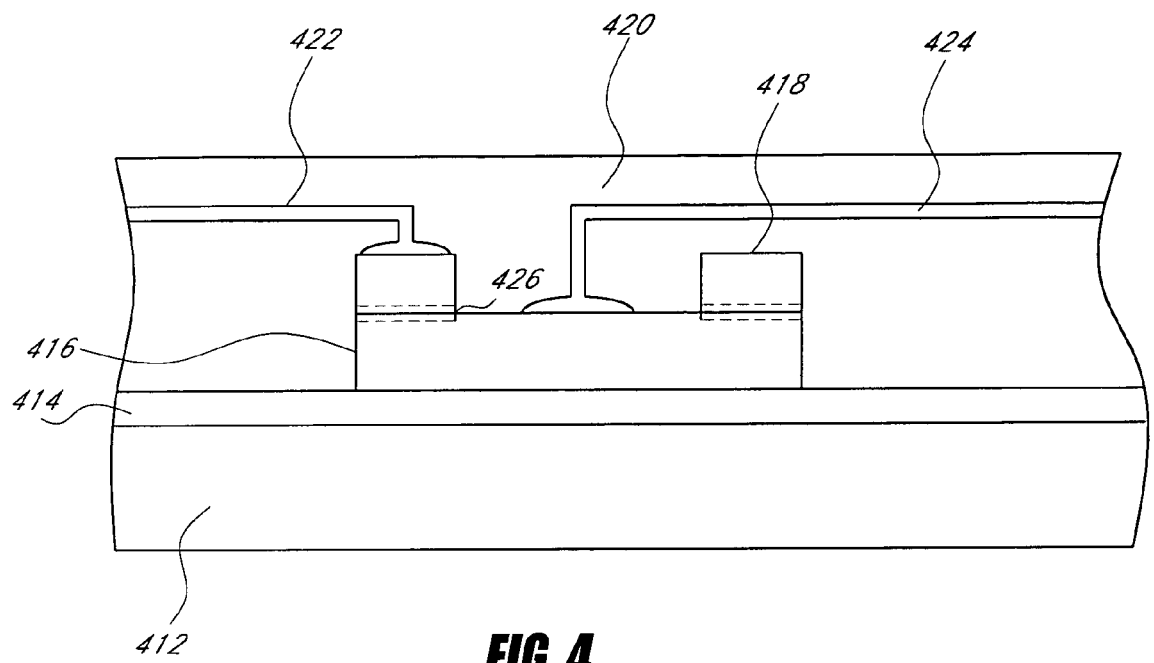
FIG. 4 is a schematic cross-sectional representation of an embodiment of a tunable ring resonator.

FIG. 4 illustrates a cross sectional view of another pn junction embodiment of the resonant cavity 204. The resonant cavity 204 comprises a disk-shaped slab 416 on top of a cladding layer 414 formed on a substrate 412. In other embodiments, an annular slab could be substituted for the disk-shaped slab 416. Other slab shapes are also possible and are generally within the capability of one of ordinary skill in the art to design. The disk-shaped slab 416 preferably has a higher index of refraction than the cladding layer 414. In one preferred embodiment, the disk-shaped slab comprises doped crystal silicon and the cladding layer 414 comprises a silicon dioxide layer (e.g., a buried-oxide layer) on a silicon substrate.

An annular strip 418, also comprising relatively high refractive index material in comparison to the cladding layer, is disposed over the slab 416. This annular strip 418 follows a path around the outer portion of the disk-shaped slab 416. The annular strip 418 has the effect of loading the outer perimeter portion of the slab 416 such that optical energy is somewhat confined to the strip 418 and the outer portion of the slab 416 beneath the strip, creating a closed, circular path for the optical energy. In one preferred embodiment, the annular strip 418 also comprises doped crystal silicon.

The thickness of the slab 416 and the strip 418, as well as their widths, will, in part, determine the optical mode or modes that are supported, their spatial extent, and the associated wavelengths. In some embodiments, these dimensions are selected so as to support a single mode such as the "whispering gallery" mode which travels within the disk shaped slab 416 around its perimeter.

A layer of cladding material 420 substantially surrounds the upper and side portions of the strip 418 and disk 416 portions of the resonant cavity 204. In certain embodiments, the cladding material 420 has a relatively low refractive index in comparison to the strip 418 and disk 416 such that light energy is substantially confined to these areas of the device. In one embodiment, the cladding material comprises silicon dioxide, though other cladding materials are also possible.

The material comprising the strip 418 and the slab 416 is preferably substantially transparent and non-absorptive to the wavelength light for which the resonant cavity 204 is designed. As mentioned, in certain embodiments, the strip 418 and slab 416 material can comprise doped crystalline silicon. Those of skill in the art will recognize that other materials may be used, however, including other semiconductors (e.g. quarternary indium gallium arsenide phosphide materials) and other forms of silicon besides crystalline silicon. Any material that is used will generally have a substantially high refractive index in comparison with the insulating material 420, 414 surrounding the resonant cavity 204 such that optical energy is confined within the cavity.

When the resonant cavity 204 of FIG. 2 is disposed sufficiently close to a waveguide propagating light, light from the waveguide may couple into the disk-shaped slab 416 of the resonant cavity. Because the disk-shaped slab 416 has a substantially higher refractive index than the upper and lower cladding 420, 414 above and below, light can be confined therein. Lateral confinement within the slab 416 is provided by the annular strip 418 which defines a substantially circular path around the perimeter region within the slab. Light coupled into the resonant cavity 204 propagates around this closed optical path partially within the slab 416 and partially within the strip 418. The optical mode will likely be distributed within the strip 418 and the region of the slab 416 substantially below the strip and in proximity thereto.

In certain embodiments of the invention, the annular strip 418 comprises doped p-type silicon, while the slab 416 comprises doped n-type silicon. In other embodiments, the doping of the strip 418 and slab 416 is reversed so that the strip 418 comprises doped n-type silicon, while the slab 416 comprises doped p-type silicon. In either case, a depletion region 426 is formed at the pn junction between the annular strip 418 and the disk-shaped slab 416.

The resonant cavity 204 further includes a first electrode 422 electrically connected to the annular strip 418. The first electrode 422 may include a substantially annular portion that tracks all or a portion of the annular strip 418 and that is electrically connected to a voltage source (or common ground). This voltage source may output a voltage waveform of any arbitrary shape depending on the particular application. In certain preferred embodiments, the voltage source comprises a high-speed electrical modulation signal. The resonant cavity 204 further includes a second (slab) electrode 424 electrically coupled to a central top surface of the disk-shaped slab 416. The electrodes may be coupled to the slab 416 and the strip 418 via ohmic contacts. The second electrode 424 is also electrically coupled to a voltage source (or common ground) allowing for the application of an electric potential difference between the strip 418 and the slab 416. Other configurations for establishing an externally imposed electric field across the pn junction are also possible. The strip and slab electrodes 422, 424 preferably are comprised of metal, although one of skill in the art would recognize that other materials, such as doped polysilicon, may be used. In many embodiments it may be preferable to position the electrodes away from the light path portion of the resonant cavity 204 since metals are generally very light-absorbent.

The width of the depletion region 426 can be modulated as described above with regard to FIG. 3 to change the density of free carriers in the region of the strip 418 and the slab 416 where optical energy exists, thereby modulating the refractive index of the resonant cavity 204 material. In this way, the resonant cavity of FIG. 4 can be selectively tuned and detuned.

Figure 5:
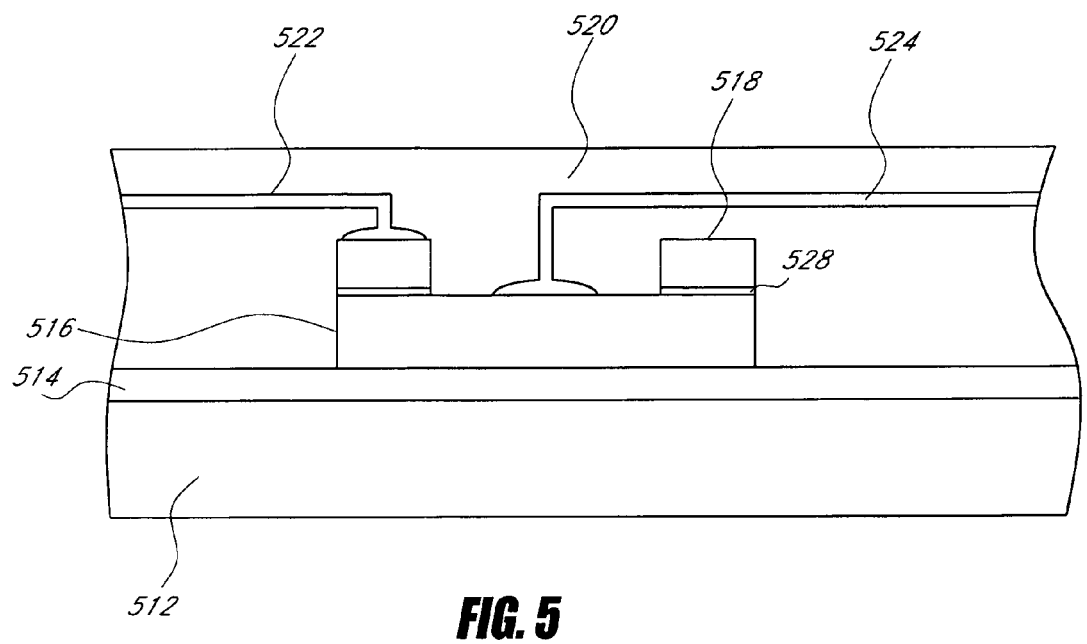
FIG. 5 is a schematic cross-sectional representation of another embodiment of a tunable ring resonator.

FIG. 5 illustrates the cross-section of yet another alternative embodiment of resonant cavity 204. Similarly to the embodiments of the resonant cavity 204 shown in FIGS. 3 and 4, the embodiment of resonant cavity 204 shown in FIG. 5 includes a substrate 512, cladding layers 514 and 520, electrodes 522 and 524, an annular strip 518, and a disk-shaped slab 516. As was the case previously, the cladding layers 514 and 520 preferably have a refractive index less than the material comprising the disk 516 and strip 518 such that optical energy can be confined within the disk and strip areas. In some embodiments, silicon dioxide is a suitable material due to its relatively low refractive index, as compared to pure or doped silicon. Also, as was the case previously, the electrodes 522 and 524 are used to apply a potential difference across the strip 518 and slab 516 structures. In general, the disclosure with respect to the counterparts of these elements in FIG. 4 also applies to FIG. 5.

The slab portion 516 of the resonant cavity 204 is illustrated as being disk-shaped, however, as before, other shapes are possible. Indeed, other shapes may be used to implement a resonant cavity of a different type, such as a linear Fabry-Perot cavity. There are a number of suitable materials of which the disk-shaped slab 516 can be made, including doped crystalline semiconductor. In one embodiment, doped crystalline silicon is used for its relatively high refractive index as compared to the silicon dioxide cladding regions 414 and 420. Other forms of silicon may also be satisfactory. Other materials can also be used for the strip 418 and slab 416. These may InGaAsP, for example, or any other III-V or III-VI semiconductor material.

One difference between the resonant cavity embodiments of FIGS. 4 and 5 is the transition layer 528 located between the slab 516 and the strip 518. The transition layer 528 is an electrically insulating, dielectric region which allows for manipulation of the optical properties of the resonant cavity 204 via the field effect, such as is exploited in MOSFET devices. Silicon dioxide is a suitable material for the transition layer 528 in some embodiments. Preferably, the thickness of the transition layer 528 is sufficient to prevent free charge carriers from passing through it either by structural defects (i.e. pin hole defects) or tunneling. However, if the transition layer 528 comprises a relatively low-refractive index material, such as silicon dioxide, then the transition layer is preferably not so thick as to substantially inhibit the confinement of optical energy to the strip 518 and the outer portion of the slab 516. The precise thickness of the transition layer 528 will vary depending on the wavelength of light for which the resonant cavity 204 is designed.

The annular strip 518 is located above the transition layer 528 and may comprise relatively high refractive index doped crystalline or polycrystalline semiconductor. Once again, silicon is an appropriate choice of material in some embodiments due to its favorable absorption characteristics in optical and surrounding regions of the electromagnetic spectrum. The annular strip 518 loads the slab 516 such that optical energy within the slab is laterally confined to the peripheral regions of the slab. This is true even when silicon dioxide, with its relatively low refractive index (in comparison with crystalline or polycrystalline silicon), is used as the transition layer 528 so long as the transition layer is sufficiently narrow. See also U.S. Pat. Nos. 6,839,488 and 6,917,727 which are incorporated herein by reference in their entirety.

The density of free carriers in a region of the disk-shaped slab 516 beneath the strip 518, and within the strip as well, may be changed via the field effect by applying a potential difference between the strip and slab electrodes 522 and 524. For example, application of an appropriate electric field to a semiconductor junction can cause a depletion of carriers near the junction. With continued application of the field, inversion may result wherein opposite type carriers are attracted to the junction and the depletion region. In this manner, the free carrier distribution in the semiconductor can be controlled and varied by applying an electric field to the semiconductor. This junction may be formed between the semiconductor and an adjacent insulator across which the electric field is applied.

Applying a voltage between the strip and slab electrodes 522 and 524 and through the insulating transition region 528 creates an electric field that may cause electrons to be depleted at the top surface of the slab 516 beneath the annular strip 518, and more particularly, beneath the insulating transition layer 528. This depletion of electrons can occur in the case where the semiconductor is doped n-type and the polarity of the applied voltage is appropriate to force the free carrier electrons away from the junction. Applying additional voltage between the strip and slab electrodes 522 and 524 may cause inversion wherein holes are attracted and accumulate at the portion of the slab 516 beneath the strip and the transition layer 528. The existence of the insulating transition layer 528 prevents the holes from flowing into the strip 518. An analogous process occurs when the semiconductor is doped p-type and the polarity of the applied voltage is appropriate to force the free carrier holes away from the junction while attracting electrons towards the junction.

The field effect enables modulation and/or control of the free carriers and free carrier density underneath the strip 518, in the general area where the optical mode is confined. As described above, the change in carrier density alters the refractive index of the medium through which the optical energy propagates. The ability to variably control the refractive index permits tuning of the resonant frequency of the cavity. The electric signal applied across the electrodes 522 and 524 can be a modulation signal, which can carry information, to modulate the optical beam propagating through the waveguide 202.

Several types of embodiments of the resonant cavity 204 have been described: an embodiment comprising a lateral pn junction, an embodiment comprising a horizontal pn junction, and an embodiment comprising a horizontal MOS-type capacitor structure. Yet another embodiment comprises a lateral-type MOS capacitor junction. The pn junction and MOS-type capacitor structures are advantageous in some embodiments because their modulation speed (i.e. the speed at which they can be tuned and de-tuned) is generally only limited by the majority carrier lifetime and depletion capacitance. Hence with proper design these devices can operate much faster than a p-i-n based modulator device which operates in a forward-biased configuration and is limited in bandwidth by the minority carrier lifetime. Other configurations, however, are also possible.

While the resonant cavity 204 in the pn junction and MOS-type capacitor embodiments has been described in terms of ridge and strip-loaded waveguides, other types of waveguides can be used without departing from the scope of the invention. The use of one type of waveguide over another may necessitate relocation of certain features, such as the electrodes, but this should be within the ability of one of ordinary skill in the art. Furthermore, while the waveguides have generally been discussed as comprising silicon in one of its many forms, the principles of this invention will work with any type of semiconductor material that allows for the construction of a resonant cavity with an adequately high Q factor. This includes quartenary indium gallium arsenide phosphide materials such as e.g., InGaAsP, InGaAs, InGaP, GaAs, or any other III-V as well as II-VI semiconductor. Finally, precise sizes, shapes, and dimensions for the resonant cavity 204 and waveguide 202 may vary depending upon the wavelength of light used in a given application, the desired coupling effects between the cavity 204 and waveguide 202, and other factors.

Any of the conventional processes for forming layers and patterning may be used to make the resonant cavity 204 according to the embodiments illustrated in FIGS. 3-5. Employing conventional processes well known in the art is advantageous because the performance of these processes is well established. SOI and CMOS fabrication processes may be used, for example, which are well developed and well tested, and are capable of reliably producing high quality products. The high precision and small feature size possible with these processes should theoretically apply to fabrication of strip-loaded waveguides as the material systems are similar. Accordingly, extremely small sized waveguide structures and components should be realizable, thereby enabling a large number of such waveguides and other components to be integrated on a single die. Although conventional processes can be employed to form the waveguides described herein, and moreover, one of the distinct advantages is that conventional semiconductor fabrication processes can readily be used, the fabrication processes should not be limited to only those currently known in art. Other processes yet to be discovered or developed are also considered as possibly being useful in the formation of these structures.

One additional advantage of these designs is that in various embodiments electronics, such as transistors, can be fabricated on the same substrate as the waveguide structures. Integration of waveguides and electronics on the same substrate is particularly advantageous because many systems require the functionality offered by both electronic, optical, electro-optical, and opto-electronic components. For example, resonant cavities, modulators, switches, and other waveguide structures, can be optically connected together in a network of waveguides and electrically connected to control and data processing circuitry all on the same die. The integration of these different components on a single die is particularly advantageous in achieving compact, complex designs.

Figure 6:
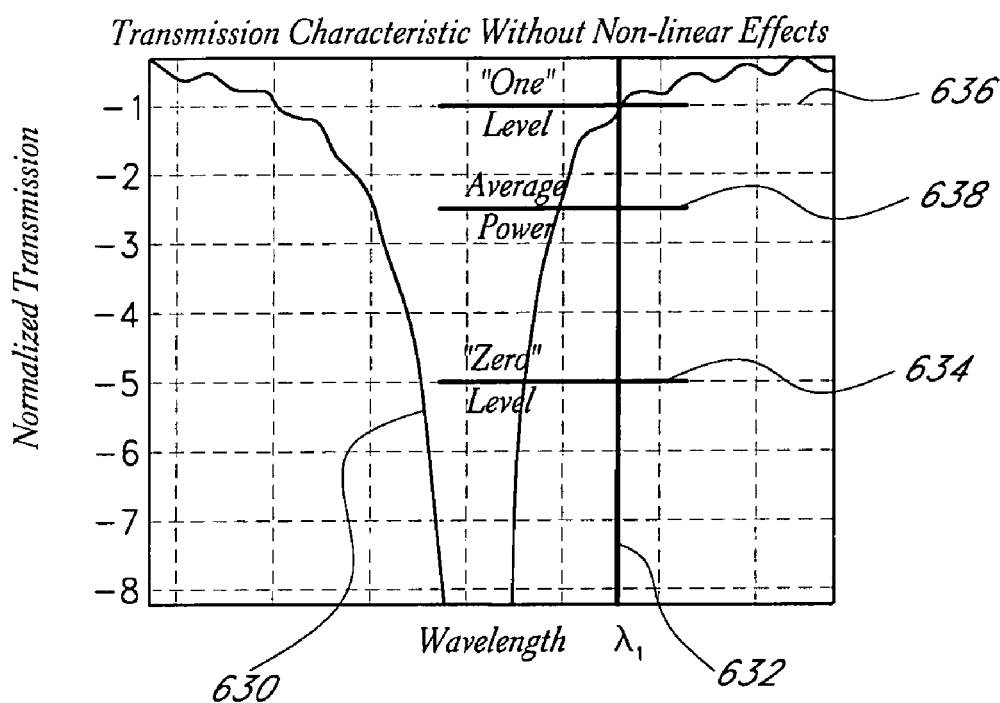
FIG. 6 is a plot showing the transmission characteristic of a tunable ring resonator without non-linear optical effects. The ring resonator is tuned to transmit a "one."

FIG. 6 shows a typical transmission plot for devices of the sort illustrated in FIG. 1 when they are operated such that the power level of the optical energy within the resonant cavity 104 is not high enough to bring about non-linear effects within the cavity. The normalized transmission coefficient for an optical beam propagating through the waveguide 104 is shown as a function of the wavelength of the optical beam. The wavelength scale can vary widely depending upon the dimensions of the waveguide 102 and the resonant cavity 104, as well as the spacing between them.

One of the principal distinguishing characteristics of the transmission curve 630 is the stop band in the middle portion of the graph, corresponding to the resonant frequency band of the resonant cavity 104. Wavelength components of an optical beam injected at the input of the waveguide 102 which lie within the stop band range are substantially attenuated at the output of the waveguide 104. The attenuation of the beam at wavelengths within the stop band of FIG. 5 is due to the effect of the resonant cavity 104 at those frequencies.

In some embodiments of the invention, the resonant cavity 104 is tunable so that the stop band of the transmission curve 630 can be shifted to higher or lower wavelengths. (In other embodiments, the stop band of the transmission curve 630 may remain relatively static while the operating wavelength of the optical beam input is modulated.) Tuning and de-tuning the resonant frequency band of the resonant cavity 104 makes modulation of an optical beam possible. For example, an optical beam propagating through the waveguide 102 with a wavelength, $\lambda 1$, which lies substantially outside of the stop band of the transmission curve 630 when the resonant frequency band of the cavity 104 is tuned to a first position will pass to the output of the waveguide 102 without appreciable attenuation. However, if the resonant cavity is tuned to a second position, according to the above-described process, such that the wavelength of the beam, $\lambda 1$, now lies substantially within the stop band, then the beam at the output of the waveguide 102 will be substantially attenuated. This process of tuning and de-tuning the resonant band of the resonant cavity 104 can be used to modulate a CW optical beam propagating through the waveguide 102 and to encode information therein.

FIG. 6 also includes markings which correspond to a digital modulation scheme used in some embodiments of the invention. Line 636 marks the transmission level of a digital "one" where the optical signal is considered "on," while line 634 marks the transmission level of a digital "zero" where the optical signal is considered "off." Line 638 shows the average power level of an optical beam modulated to create an arbitrary digital data signal. The ratio of the optical power level of a "one" to the power level of a "zero" is referred to as the extinction ratio. It is preferable for the extinction ratio of an optical modulator to be large enough to allow the on and off states of the optical signal to be readily distinguishable so that the data encoded in the signal can be reliably decoded.

Figure 7:
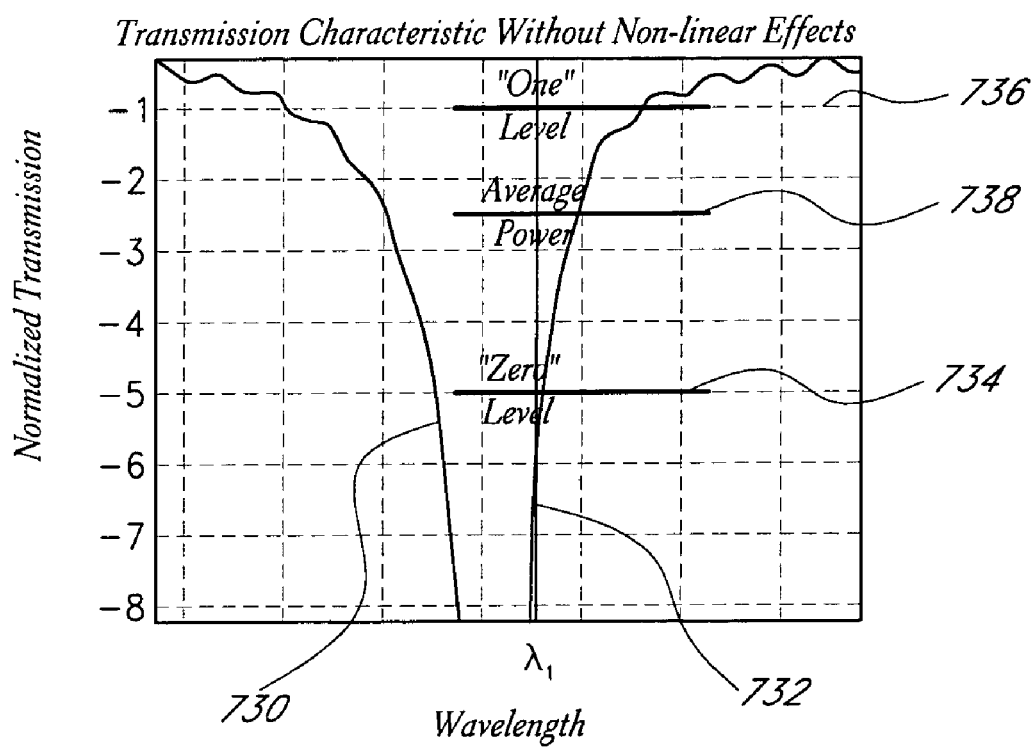
FIG. 7 is a plot showing the transmission characteristic of a tunable ring resonator without non-linear optical effects. The ring resonator is tuned to transmit a "zero."

The vertical line 632 represents the operating wavelength of a CW optical beam injected into the waveguide 102 by an optical source 108. In the case shown in FIG. 5, the resonant cavity 104 is tuned such that an optical beam, having a wavelength $\lambda 1$, lies substantially outside of the stop band of the device and a digital "one" is transmitted. FIG. 7 illustrates the case where the resonant cavity 104 has been tuned such that $\lambda 1$, represented by vertical line 732, now lies substantially within the stop band and a "zero" is transmitted at the output of the waveguide 102.

Figure 8:
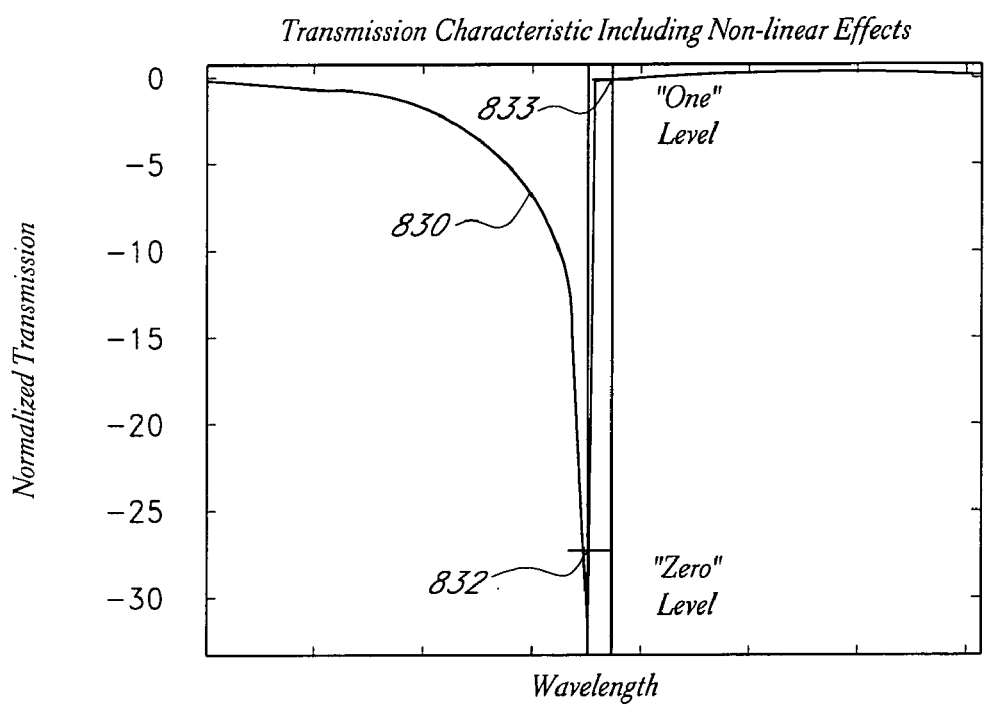
FIG. 8 is a plot showing the transmission characteristic of a tunable ring resonator including non-linear effects.

FIG. 8 shows a typical transmission plot for devices of the sort illustrated in FIG. 1 when they are operated in accordance with certain embodiments of the invention such that the power level of the optical energy within the resonant cavity 104 is high enough to bring about non-linear effects within the cavity, such as the Kerr Effect. One of the principal defining features of FIG. 8, with respect to FIGS. 6 and 7 where there is insufficient power within the resonant cavity 104 to induce non-linear optical effects, is the steep transition of the stop band portion of the transmission curve 830 near the upper wavelength cutoff. The left-hand side of the transmission curve 830, corresponding to the lower wavelength cutoff of the stop band, is generally comparable to that demonstrated by devices operated within a linear optical realm. The right-hand side of the transmission curve 830, however, is far steeper due to the non-linear effects brought about by the intensity levels of the optical energy within the resonant cavity 104 material.

It should be understood that even though throughout this specification the optical power level needed to achieve non-linear effects within the resonant cavity 104 material is described as "high" or "relatively high," through careful engineering of the coupling of optical energy into the resonant cavity 104, non-linear optical effects can be brought about within the resonant cavity 104 even at relatively low power levels. This is true of both non-pumped and pumped embodiments. Therefore, the power level within resonator 104 can be increased either by increasing the power level output by the optical source 108 or by modifying the structural design of the waveguide 102 and resonant cavity 104 so that energy is more effectively coupled into the resonant cavity. In certain embodiments, the power supplied through the waveguide 102, whether in non-pumped or pumped embodiments, or some combination of the two, is about 5 dbm or higher. In other more preferred embodiments, the power level is about 8 dbm or higher.

In some embodiments of the invention, the optical intensity within the resonant cavity 104 may be set such that the Kerr Effect causes the extinction ratio of the device to increase by about 3 dB, when compared to a modulator that does not utilize non-linear optical effects, for a given applied voltage across the modulation signal electrodes. In other embodiments, the intensity can be set such that the extinction ratio increases by about 6 dB. In other preferred embodiments, the optical intensity may be increased such that the Kerr Effect allows for an attainable extinction ratio of more than 10 dB higher than would be achieved for a modulator without the non-linear optical effects for a given applied voltage across the modulation signal electrodes.

In certain preferred embodiments of the invention, the wavelength, λ1, of the CW optical beam-to-be-modulated is set so that the tuning/de-tuning action of the resonant cavity 104 occurs about the steep slope of the transmission curve 830. This can be done by adjusting the wavelength of the light source 108, by engineering the dimensions and structure of the resonant cavity 104 such that the steep slope of the stop band is located at λ1, or by some combination of the two methods. In addition, some embodiments of the invention include a bias monitoring and control system (not shown) in the vicinity of the ring (potentially integrated onto the same die) that maintains the alignment of the steep slope of the transmission curve 830 with the operating wavelength, λ1, of the optical source 108 over time through mechanical and environmental changes. In preferred embodiments, a bias control signal is applied to the resonant cavity 104 through a separate set of electrodes (not shown) other than those used to apply the high-speed electrical modulation signal. The bias monitoring and control system may operate thermally to counteract low frequency fluctuations in the resonant frequency band of the resonant cavity 104. In other embodiments, the bias monitoring and control system can counteract slow drifts in the position of the resonant frequency band of the resonant cavity 104 by applying a low frequency control signal to the resonant cavity 104.

In one embodiment, the combination of the optical source 108 and the resonant cavity 104 can be engineered so that the modulator outputs a "one" when no voltage is applied to the resonant cavity 104 electrodes. In another embodiment, the optical source 108 and resonant cavity 104 can be engineered so that the modulator outputs a "zero" when no voltage is applied. In still other embodiments, the modulator can be designed so that it outputs an intermediate power level when no voltage is applied to the electrodes. Other arrangements may also be possible.

The steep transmission curve 830 caused by the effects of the high intensity optical energy within the resonant cavity 104 makes possible a very high-speed electro-optical modulator that is very efficient and operates with a high extinction ratio at very low driving voltages supplied to the electrodes of the resonant cavity 104. The operation of the optical modulator with non-linear effects is similar to that described with respect to FIGS. 6 and 7. However, the optical modulator device represented by the transmission plot of FIG. 8 is superior to the device represented by FIGS. 6 and 7 because a much smaller shift in the position of the stop band of the transmission curve 830, with respect to the wavelength, λ1, of the beam-to-be-modulated, achieves the same or better performance in terms of extinction ratio. This is illustrated by the small wavelength spacing between the "one" line 733 and the "zero" line 732 in comparison to the corresponding spacing for a modulator that is not designed to take advantage of non-linear optical effects.

A relatively small shift in the location of the resonant frequency band results in a large change in transmitted power because of the steepness of the transmission curve 830. The smaller required shift in the location of the stop band also results in greater achievable modulation speeds. Furthermore, the modulator represented by the transmission curve 830 of FIG. 8 is highly efficient because the smaller shift in the resonant band of the resonant cavity 104 allows smaller voltages to be applied to the electrodes of the resonant cavity 104 to achieve the necessary shift. The steep transmission curve 830 also allows for modulation of an optical beam with very little distortion, suitable perhaps even for analog modulation schemes.

Certain embodiments of the device can achieve modulation speeds of about 10 Gbps, using a peak-to-peak control voltage of about 2 V, or less, to achieve an extinction ratio of about 5 dB. Other more preferred embodiments are capable of achieving modulation speeds of about 10 Gbps, using a peak-to-peak control voltage of about 500 mV, or less, to achieve an extinction ratio of about 6 dB, or greater. Still other embodiments, may use a peak-to-peak control voltage of about 200 mV or less to modulate an input signal with an extinction ratio of about 6 dB.

Figure 9C:
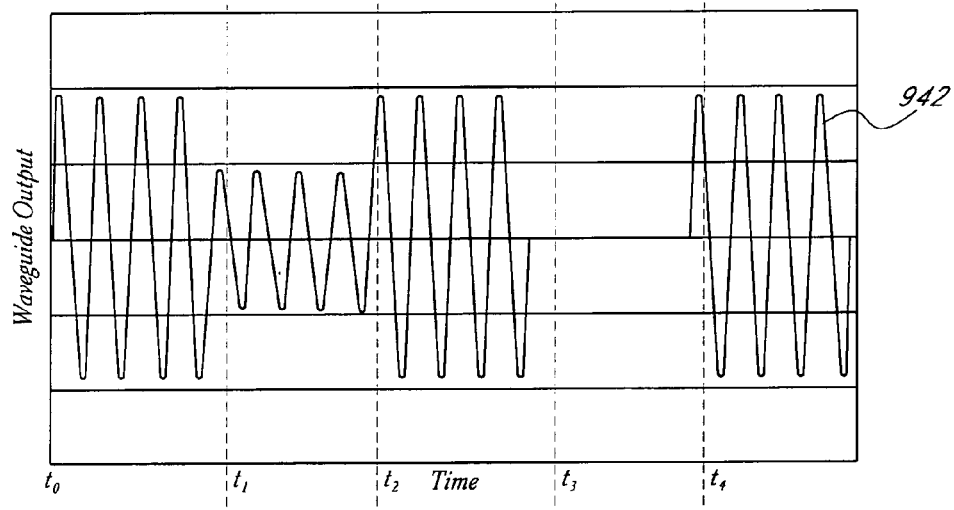
FIG. 9 is a series of plots illustrating an optical input signal, a modulation signal which controls a tunable ring resonator, an output signal comprising the modulated input signal, and the position of a transmission curve with respect to the wavelength of the input signal during various time intervals.
Figure 9D:
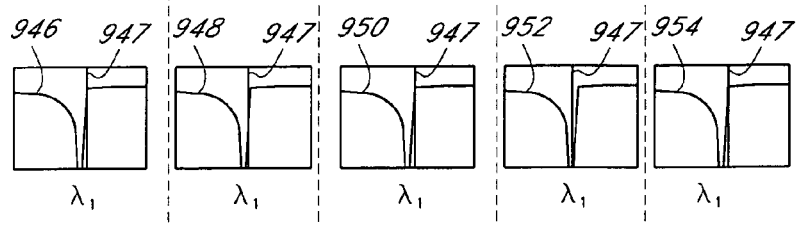

FIG. 9 is a series of plots which illustrate one exemplary form of modulation that can be performed by the modulator of FIG. 1. FIG. 9A is a plot of a modulation signal 940 which tunes the resonant cavity 104. FIG. 9B is meant to illustrate an exemplary sinusoidal CW waveguide input beam 942 and FIG. 9C is the corresponding modulated output signal 942. Each is plotted versus time. FIG. 9D (curves 946, 948, 950, 952 and 954) represent the position of the transmission curve 830 with respect to the wavelength (demarcated by vertical lines 947) of the sinusoidal, CW, waveguide input beam 842 during the time interval spacings between which each curve is drawn. From time t0 to time t1, the modulation signal is configured so that the modulator attenuates the input beam 942 little, if at all. Accordingly, the transmission curve 946 is tuned so that the wavelength of the input signal, marked by line 947, lies outside of the stop band.

At time t1, the modulation signal transitions in such a way as to cause the waveguide output to be attenuated. The transmission curve 948 is shifted so that the wavelength of the input beam, marked again by line 947, lies somewhat within the stop band and the amplitude of the optical signal at the output port of the waveguide 102 is correspondingly decreased. Similar transitions occur at times t2, t3, and t4. During the interval from time t3 to time t4, the transmission curve 952 is shifted so that the input beam is very substantially attenuated.

Some embodiments of the invention will employ a digital modulation (e.g. binary) scheme where the modulation signal 940 takes on only a discrete number of values (e.g. two), though the precise number of values will vary from application to application. Other embodiments of the invention may allow for the modulation signal 840 to take on a substantially continuous range of values, as would be the case in an analog modulation scheme.

Figure 10:
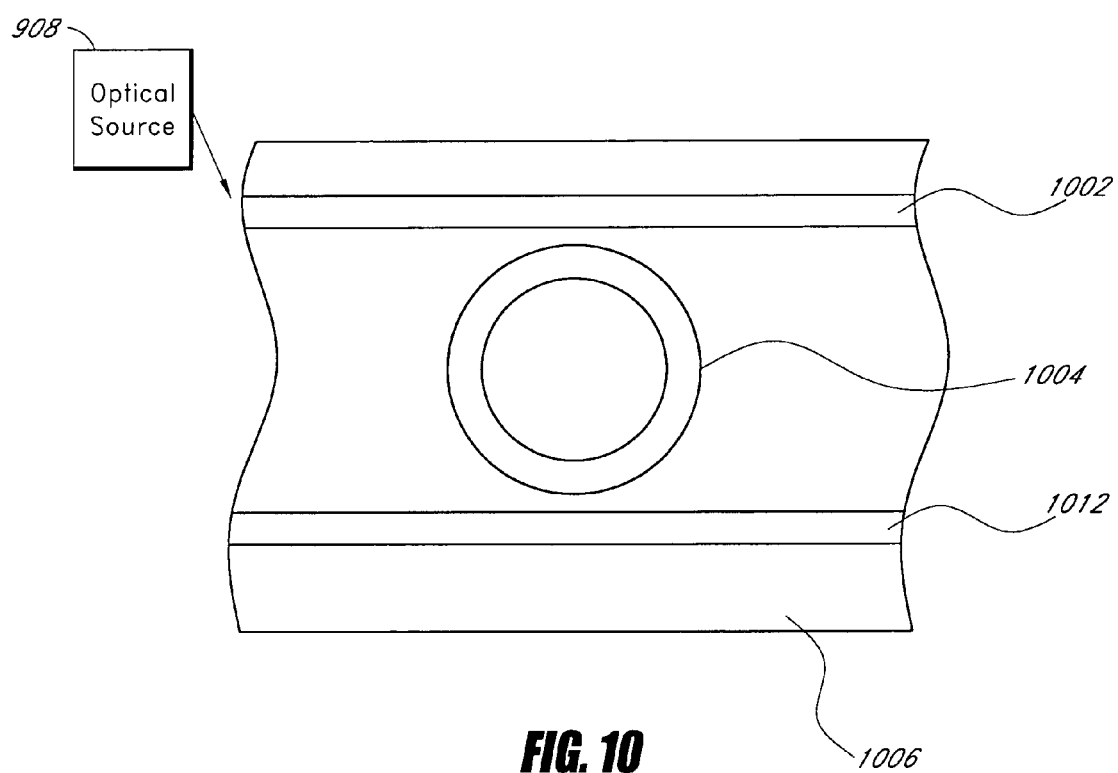
FIG. 10 is a schematic representation of an optical device including a tunable ring resonator disposed in proximity to two waveguides.

FIG. 10 illustrates another embodiment of the invention. The optical device of FIG. 10 includes a first waveguide 1002 and a second waveguide 1012 disposed on a substrate 1006. A tunable resonant cavity 1004 is disposed between the two waveguides 1002, 1012. While the resonant cavity 1004 is shown as a ring resonator, other types of resonators can be used in other embodiments. The optical device of FIG. 10 also includes an optical beam source 1008, which in some embodiments injects a CW optical beam into waveguide 1002. The above disclosure, for example, regarding the construction, materials, and operation of waveguides and the resonant cavity generally applies to the device of FIG. 10.

In one embodiment, the optical beam source 1008 injects a CW optical beam into the input of the first waveguide 1002. The optical beam propagates through the waveguide 1002 toward the tunable resonant cavity 1004. If the resonant cavity 1004 is tuned so that the wavelength of the optical beam is not located within the resonant frequency band of the resonant cavity 1004, then the beam will generally not couple into the resonant cavity but will continue propagating toward an output port of the first waveguide 1002. If, however, the resonant cavity 1004 is tuned so that the wavelength of the optical beam is located within the resonant frequency band of the resonant cavity 1004, then the device is designed so that at least a portion of the optical beam will be coupled into the resonant cavity. From the resonant cavity, at least a portion of the optical beam will then be coupled into the second waveguide 1012 where it will propagate toward an output port thereof. Thus, the device configuration illustrated in FIG. 10 can behave as an optical switch to couple an optical signal propagating through the first waveguide 1002 to the second waveguide 1012 as the resonant cavity 1004 is tuned and de-tuned in a controlled manner. The device illustrated in FIG. 10 can also be used as an optical modulator where the modulated signal is taken at the output port of the second waveguide 1012.

In certain preferred embodiments, the optical source 1008 is configured to output sufficient power to induce optical non-linearities within the resonant cavity 1004 material, without an additional optical pump source, though pumped embodiments are also possible. As illustrated in FIG. 8, the non-linear optical effects cause the transmission curve to become much steeper near the upper wavelength cutoff.

When the optical device of FIG. 10 is used as a switch and is operated about this steep curve, the switch can be operated at a much higher speed than would otherwise be the case. This is due to the fact that only relatively small shift in the resonant frequency band of the resonant cavity 1004 is necessary to effectively couple an optical beam from the first waveguide 1002 into the resonant cavity and on to the second waveguide 1012. Since the required shift in the resonant frequency band is smaller, it can be done more quickly. Furthermore, since the shift in the resonant frequency band is approximately proportional to the voltage applied across the resonant cavity electrodes, this small shift can be accomplished by a proportionately smaller applied voltage. Thus, the device illustrated in FIG. 10 comprises a high-speed, low-voltage optical switch. When the optical device of FIG. 10 is used as a modulator, it behaves similarly to the device illustrated in FIG. 1.

In another embodiment of the invention, the device of FIG. 1 may be operated in the following manner. A modulated optical beam, having a wavelength that lies near the upper wavelength cutoff of the modulator stop band, can be propagated through the waveguide 102. The power level of the modulated optical beam may switched from a lower level to a sufficiently high level during certain intervals so as to shift the resonant cavity 104 from a primarily linear mode of operation to a primarily non-linear mode of operation. This modulation in the power level of the optical beam would cause a shift in the transmission characteristic of the modulator device from approximately what is illustrated in FIGS. 6 and 7 to the characteristic illustrated in FIG. 8, and vice versa.

When the power level of optical beam is set such that the resonant cavity 104 is operating in a primarily linear mode, the application of an electrical modulation signal to the resonant cavity will result in relatively small changes to the amplitude of the optical beam propagating through the waveguide 102 due to the relatively shallow slope of the upper wavelength edge of the modulator stop band when the modulator is operated without non-linear effects. However, the changes to the amplitude of the optical beam will be much greater, for the same peak-to-peak modulation voltage, when the resonant cavity is transitioned to a primarily non-linear state of operation, due to the relatively steep slope of the transmission curve during operation with non-linear effects. In this way, the non-linear optical effects within the resonant cavity 104 can be used to amplify the modulation of the optical beam.

Figure 11:
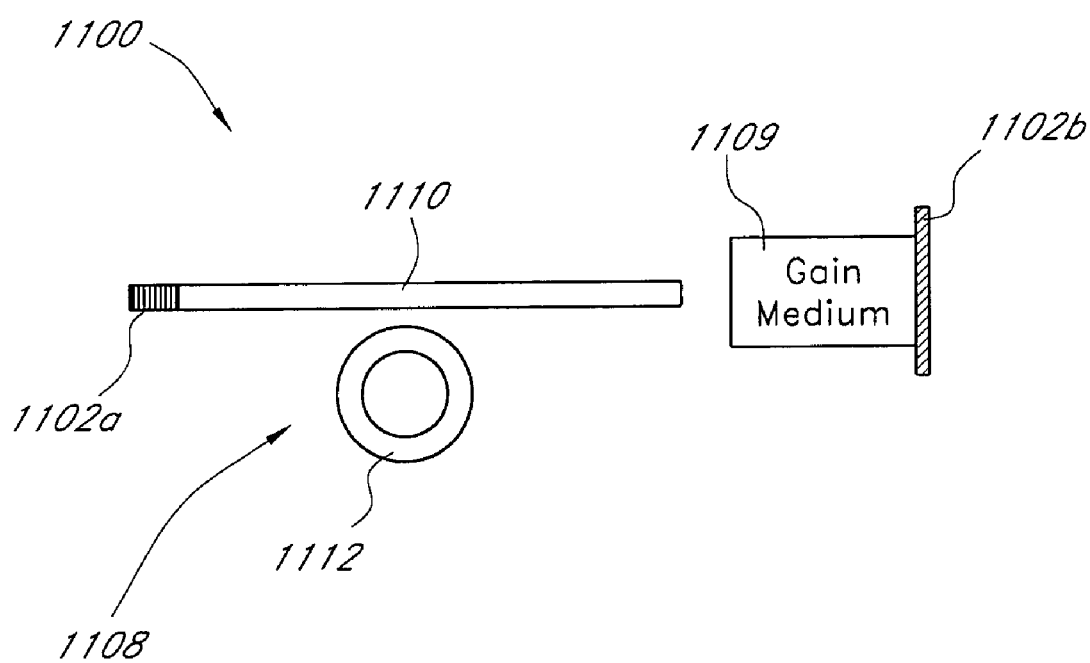
FIG. 11 is a schematic diagram of a mode locked laser comprising a modulator such as described herein.

In yet another embodiment of the invention, the modulation device of FIG. 1 can be used in a laser mode-locked laser 1100 such as shown in FIG. 11. The mode locked laser 1100 comprises an optical cavity defined by first and second reflectors 1102*a*, 1102*b*. In the embodiment shown, the first reflector 1102*a* comprises a Bragg reflector while the second reflector 1102*b* comprises metallization, an interference coating or a facet. In other designs the first and second reflectors 1102*a*, 1102*b* may be configured differently. The laser 1100 further comprises a gain medium 1104 in the laser cavity. To provide mode locking, an optical modulator 1106 can be positioned within the optical path in the laser cavity such as shown in FIG. 11. The optical modulator 1106 includes a first waveguide portion 1110 and a second waveguide resonator 1112. The laser cavity optical path includes the modulator 1110 and the gain medium 1104 positioned between reflectors 1102*a*, 1102*b*.

In some embodiments, the first waveguide portion 1110 and the second waveguide resonator 1112 comprises semiconductor waveguide structures such as silicon waveguide structures formed on a substrate. Additionally, in certain embodiments, the gain medium 1004 is not integrated on a single substrate with the optical modulator 1108 but rather is externally coupled to the modulator via optical fiber, a flip-chip configuration, or using different approaches. The gain medium 1104 in some embodiments may, for example, comprise a quarternary indium gallium arsenide phosphide material or III-V material. The mode locked laser 1100 may further comprise a grating coupler (not shown) to couple light from the first waveguide portion 1110 to the gain medium 1104. A wide variety of other configurations, however, are possible.

The modulator 1108 is used to mode lock the laser 1100. If, for example, the amplitude of light within the laser cavity is modulated in synchronization with the cavity round-trip time, then a plurality of the longitudinal modes existing within the cavity will become phase locked, producing light pulses of extremely short duration. In preferred embodiments, the free spectral range of the resonant cavity 1112 is a sub-multiple of the free spectral range of the laser cavity. The high intensity of the light within the resonator induces nonlinear affects in the modulator, as described above, resulting in increased sensitivity of the modulator to applied voltages. Additionally, the modulation can be performed with very small voltages applied to the modulator 1108 as described above. Additionally, in some embodiment, a peak-to-peak modulation voltage of about 200 mV can be used.

Preferred embodiments of the claimed inventions have been described in connection with the accompanying drawings. However, a wide variety of variation is possible. Components, and/or elements may be added, removed, or rearranged. Additionally, processing steps may be added, removed, or reordered. While only a few preferred embodiments have been explicitly described, other embodiments will become apparent to those of ordinary skill in the art of the claimed inventions based on this disclosure. Therefore, the scope of the disclosed inventions is intended to be defined by reference to the appended claims and not simply with regard to the explicitly described embodiments of the inventions.

What is claimed is:

1. A method for manipulating an optical beam, having a bandwidth centered about $\lambda 1$, said method comprising:
    propagating an optical beam along a first waveguide;
    attenuating the optical beam in said first waveguide by inducing destructive interference with a resonant cavity proximal to said first waveguide, said resonant cavity comprising a medium optically transmissive to said optical beam and having an effective refractive index, n;

modulating said attenuation induced in said first waveguide by tuning and detuning said resonant cavity using a first effect, said tuning and detuning accomplished by varying a modulation signal applied to said resonant cavity to alter the effective refractive index, n, of said medium in said tunable resonant cavity; and increasing the sensitivity of the tunable resonant cavity to said modulation signal using a second effect, the second effect being different from the first effect, wherein the second effect comprises providing optical energy of sufficient intensity within the resonant cavity to induce a non-linear optical effect in the medium in said resonant cavity.

2. The method of claim 1, further comprising switching at least a portion of said optical beam from said first waveguide to a second waveguide, also proximal to said resonant cavity.

3. The method of claim 1, wherein applying said modulation signal comprises applying an electric modulation signal to said resonant cavity.

4. The method of claim 3, wherein said electric signal has a voltage less than one volt.

5. The method of claim 3, wherein said electric signal has a voltage less than 500 millivolts.

6. The method of claim 3, wherein said electric signal has a voltage less than 200 millivolts.

7. The method of claim 1, wherein said optical beam is modulated using an extinction ratio of at least about 6 dB.

8. The method of claim 1, wherein said optical beam is modulated using an extinction ratio of about 10 dB.

9. The method of claim 1, wherein at least one of said first waveguide and said resonant cavity comprises silicon.

10. A method for manipulating an optical beam, having a bandwidth centered about $\lambda 1$, said method comprising:

propagating an optical beam along a first waveguide;

attenuating the optical beam in said first waveguide by inducing destructive interference with a resonant cavity proximal to said first waveguide, said resonant cavity comprising a medium optically transmissive to said optical beam and having an effective refractive index, n, wherein said resonant cavity has a resonant frequency band defined by a low wavelength cutoff and a high wavelength cutoff, and said resonant cavity is operated so that the center wavelength, $\lambda 1$, of said optical beam is nearer to said high wavelength cutoff than said low wavelength cutoff;

modulating said attenuation induced in said first waveguide by tuning and detuning said resonant cavity, said tuning and detuning accomplished by varying a modulation signal applied to said resonant cavity to alter the effective refractive index, n, of said medium in said tunable resonant cavity; and increasing the sensitivity of said tunable resonant cavity to said modulation signal by providing optical energy of sufficient intensity within the resonant cavity to induce a non-linear optical effect in the medium in said resonant cavity.

11. The method of claim 10, wherein tuning and detuning said resonant cavity comprises shifting said resonant frequency band relative to wavelength, $\lambda 1$.

12. The method of claim 10, wherein inducing said non-linear optical effect causes a steepening of the high wavelength portion of the resonant band.

13. The method of claim 1, wherein providing optical energy of sufficient intensity within the resonant cavity to induce said non-linear optical effect in the medium in said resonant cavity comprises increasing the power level of said optical beam to about 8 dBm.

14. The method of claim 1, further comprising propagating a pump beam in said resonant cavity to provide said optical energy of sufficient intensity within the resonant cavity to induce said non-linear optical effect in the medium of said resonant cavity.

15. The method of claim 1, wherein said optical energy that is provided in said resonant cavity comprises a continuous wave optical signal.

16. The method of claim 1, wherein said optical energy that is provided in said resonant cavity is amplitude modulated between intensity levels that are insufficient to induce said non-linear optical effect in the medium in said resonant cavity and intensity levels that are sufficient to induce said non-linear optical effect in the medium in said resonant cavity.

17. The method of claim 14, wherein said pump beam comprises a continuous wave optical signal.

18. The method of claim 14, wherein said pump beam comprises a modulated optical signal.

19. The method of claim 1, wherein said non-linear optical effect comprises a $X^{(3)}$ non-linear optical effect.

20. The method of claim 19, wherein said $X^{(3)}$ non-linear optical effect comprises the Kerr effect.

21. The method of claim 1, further comprising coupling said optical beam into said resonant cavity, and setting the power of said optical beam to a level such that it is of sufficient intensity to induce said non-linear optical effect in the medium in said resonant cavity after coupling into said resonant cavity.

22. The method of claim 1, wherein using the first effect comprises causing charge carriers within the resonant cavity to be redistributed.

23. The method of claim 1, wherein using the first effect comprises modulating the width of a depletion region.

24. The method of claim 1, wherein using the first effect comprises modulating the width of an inversion layer.

25. The method of claim 10, further comprising switching at least a portion of said optical beam from said first waveguide to a second waveguide, also proximal to said resonant cavity.

26. The method of claim 10, wherein applying said modulation signal comprises applying an electric modulation signal to said resonant cavity.

27. The method of claim 26, wherein said electric signal has a voltage less than one volt.

28. The method of claim 26, wherein said electric signal has a voltage less than 500 millivolts.

29. The method of claim 26, wherein said electric signal has a voltage less than 200 millivolts.

30. The method of claim 10, wherein said optical beam is modulated using an extinction ratio of at least about 6 dB.

31. The method of claim 10, wherein said optical beam is modulated using an extinction ratio of about 10 dB.

32. The method of claim 10, wherein at least one of said first waveguide and said resonant cavity comprises silicon.

33. The method of claim 10, wherein providing optical energy of sufficient intensity within the resonant cavity to induce said non-linear optical effect in the medium in said resonant cavity comprises increasing the power level of said optical beam to about 8 dBm.

34. The method of claim 10, further comprising propagating a pump beam in said resonant cavity to provide said optical energy of sufficient intensity within the resonant cavity to induce said non-linear optical effect in the medium of said resonant cavity.

35. The method of claim 34, wherein said pump beam comprises a continuous wave optical signal.

36. The method of claim 34, wherein said pump beam comprises a modulated optical signal.

37. The method of claim 10, wherein said optical energy that is provided in said resonant cavity comprises a continuous wave optical signal.

38. The method of claim 10, wherein said optical energy that is provided in said resonant cavity is amplitude modulated between intensity levels that are insufficient to induce said non-linear optical effect in the medium in said resonant cavity and intensity levels that are sufficient to induce said non-linear optical effect in the medium in said resonant cavity.

39. The method of claim 10, wherein said non-linear optical effect comprises a $X^{(3)}$ non-linear optical effect.

40. The method of claim 39, wherein said $X^{(3)}$ non-linear optical effect comprises the Kerr effect.

41. The method of claim 10, further comprising coupling said optical beam into said resonant cavity, and setting the power of said optical beam to a level such that it is of sufficient intensity to induce said non-linear optical effect in the medium in said resonant cavity after coupling into said resonant cavity.

42. The method of claim 10, wherein modulating said attenuation by tuning and detuning said resonant cavity comprises causing charge carriers within said resonant cavity to be redistributed.

43. The method of claim 10, wherein modulating said attenuation by tuning and detuning said resonant cavity comprises modulating the width of a depletion region.

44. The method of claim 10, wherein modulating said attenuation by tuning and detuning said resonant cavity comprises modulating the width of an inversion layer.

* * * * *